United States Patent [19]

Fujisaki et al.

[11] Patent Number: 5,065,275
[45] Date of Patent: Nov. 12, 1991

[54] MULTILAYER SUBSTRATE WITH INNER CAPACITORS

[75] Inventors: Teruya Fujisaki; Katsuhiko Onitsuka; Yoshihiro Fujioka; Nobuyoshi Fujikawa; Masakazu Yasui; Akira Hashimoto, all of Kokubun, Japan

[73] Assignee: Kyocera Corporation, Kyoto, Japan

[21] Appl. No.: 590,085

[22] Filed: Sep. 27, 1990

[30] Foreign Application Priority Data

Sep. 29, 1989 [JP] Japan .................................. 1-256144
Jul. 17, 1990 [JP] Japan .................................. 2-188875

[51] Int. Cl.$^5$ ........................ C04B 35/46; H05K 1/14; H01G 4/10
[52] U.S. Cl. .................................. 361/321; 174/250; 252/62.3 BT
[58] Field of Search .................... 361/321; 264/63, 64; 29/25, 42; 501/134–138; 252/62.3 BT; 174/68.5

[56] References Cited

U.S. PATENT DOCUMENTS 4,302,625 11/1981 Hetherington et al. ............ 174/68.5
4,542,107 9/1985 Kato et al. ......................... 501/134
4,882,652 11/1989 Furukawa et al. .................. 361/321

Primary Examiner—Donald A. Griffin
Attorney, Agent, or Firm—Spensley Horn Jubas & Lubitz

[57] ABSTRACT

A multilayer substrate with inner capacitors comprising a dielectric layer sandwiched between upper and lower insulating layers, a couple of printed electrodes in desired patterns within the thickness of the dielectric layer so as to form each capacitor at the portion of the dielectric layer corresponding to the electrodes, and a couple of leading terminals on one surface of the insulating layer, which communicate with the electrodes, the multilayer substrate being characterized in that the dielectric layer is composed of a ceramic composition mainly comprising $MTiO_3$-based ceramics (M represents one or several of Ba, Ca, Mg, La, Sr and Nd) and the insulating layer is composed of a ceramic composition mainly comprising $MgO$-$SiO_2$-$CaO$-based ceramics, which is defined by an area surrounded by the lines connecting points A, B, C, D, E, F and G as shown in FIG. 1 and listed below, wherein X, Y and Z respectively represent weight percent values of MgO, $SiO_2$ and CaO at points A, B, C, D, E, F and G.

|   | X  | Y  | Z  |
|---|----|----|----|
| A | 60 | 40 | 0  |
| B | 40 | 60 | 0  |
| C | 30 | 60 | 10 |
| D | 30 | 50 | 20 |
| E | 20 | 50 | 30 |
| F | 40 | 30 | 30 |
| G | 60 | 30 | 10 |

With this multilayer substrate, the dielectric layer and the insulating layers can be co-fired. Therefore, cracking between the layers can be prevented and the superior insulation characteristics, such as insulation resistance and dielectric breakdown voltage, of the substrate can be maintained.

14 Claims, 3 Drawing Sheets

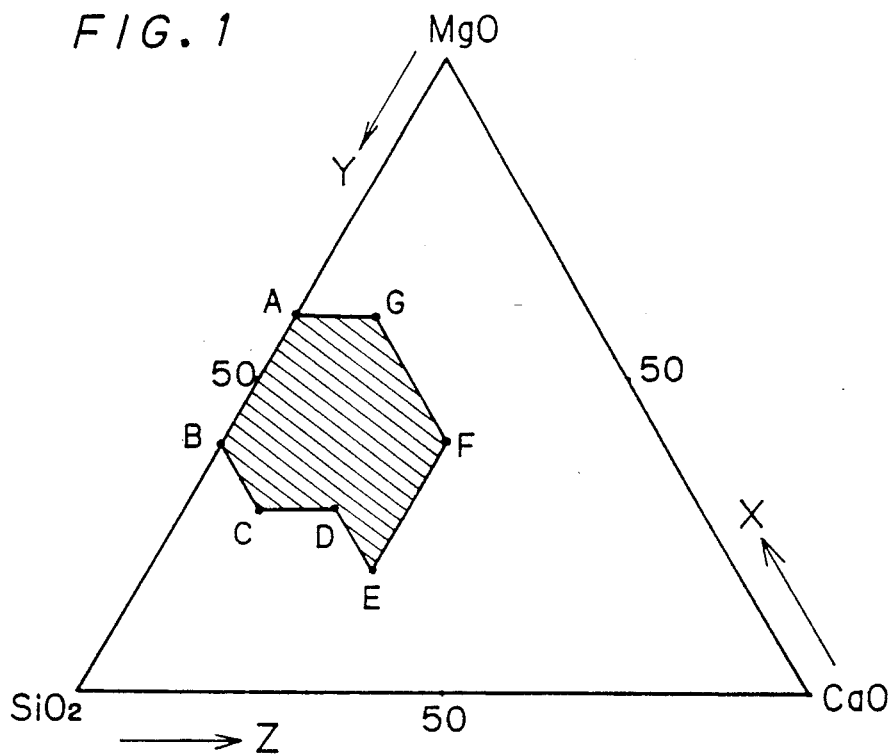
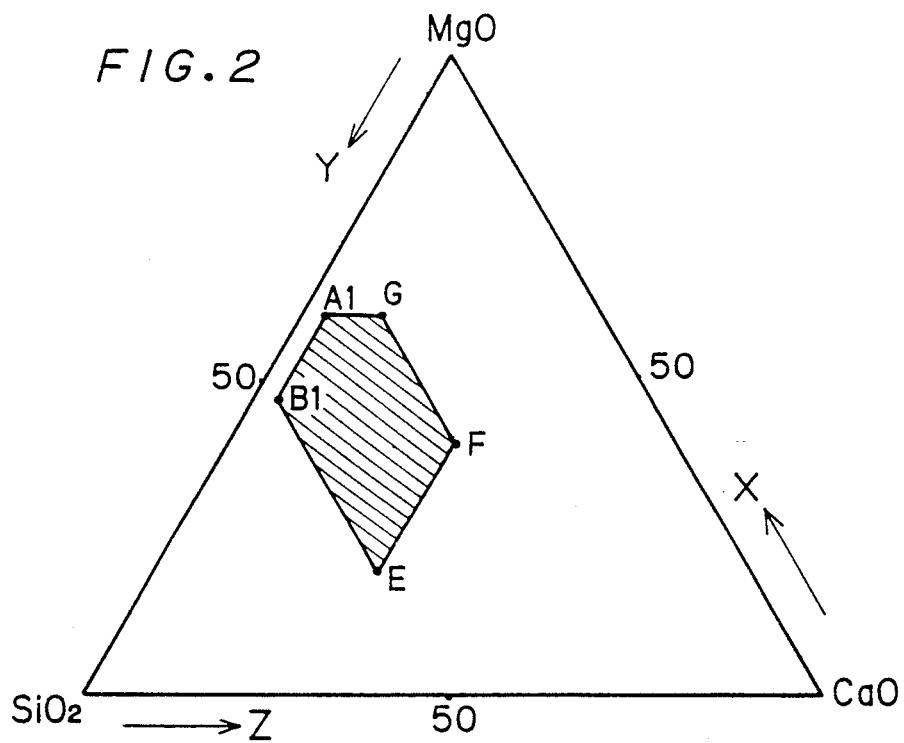

MULTILAYER SUBSTRATE WITH INNER CAPACITORS

BACKGROUND OF THE INVENTION

1. Field of the Invention

The present invention relates to a multilayer substrate with inner capacitors, which has capacitors, resistors and electric wiring conductor sections, and more particularly to a multilayer substrate with inner capacitors made by co-firing insulating layers and dielectric layers.

2. Prior Art

These days, a variety of electronic elements are being made smaller in size and mounted higher in density by use of semiconductor integrated circuit devices, such as ICs and LSIs. To cope with this trend, insulating substrates on which such semiconductor integrated circuit devices are mounted are required to be made smaller in size and higher in density. To meet these requirements, electric wires are being made thinner and multi-layered to increase density, and passive elements in electronic circuits, such as capacitors and resistors, are made in the form of chips. In addition, these miniaturized passive elements are attached to the electric wiring conductor sections provided on both sides of an insulating substrate, a practical use of both-side mounting of elements.

However, the significant advancement of semiconductor materials requires electric elements to be made far smaller in size and mounted far higher in density. The above-mentioned miniaturized passive elements, however, cannot fully meet the requirements.

To meet the requirements, a composite ceramic substrate has been proposed. The capacitor section (passive element) of this proposed substrate is printed as a thick film on an insulating layer (green sheet) by screen printing for example. Together with electrode sections and internal wiring conductor sections which are printed on the insulating layer by the same method as described above, the capacitor section is co-fired with the above-mentioned insulating layer. Other electric wiring conductor sections and resistor sections are then printed by the above-mentioned screen printing method on the insulating layer thus fired. The conductor sections and resistor sections are fired to obtain a hybrid composite ceramic substrate, thereby making electric elements smaller in size and higher in density. (Refer to Japanese Patent Publication No. 63-55795.)

In the case of this conventional composite ceramic substrate, when the dielectric layer made of a ceramics mainly comprising barium titanate ($BaTiO_3$) for example is laminated with an insulating layer mainly comprising alumina which is high in mechanical strength, chemically stable and superior in insulation performance, and when the alumina ceramics of the insulating layer is co-fired with the ceramics comprising barium titanate of the dielectric layer, with the two ceramics being in contact with each other, these ceramics react with each other and the desired characteristics of the dielectric layer cannot be obtained. In addition, it is difficult to coincide the firing temperature of the ceramics comprising the alumina of the insulating layer with that of the ceramics comprising the barium titanate of the dielectric. layer. Furthermore, cracks are generated in the dielectric layer due to the difference in thermal expansion coefficient between the insulating layer and the dielectric layer, thereby reducing the insulation resistance and dielectric breakdown voltage of the capacitor section.

SUMMARY OF THE INVENTION

In order to eliminate the above-mentioned drawbacks, the object of the present invention is to provide a multilayer substrate whose dielectric and insulating layers can be co-fired. More particularly, the dielectric layer is available in three types: a high-capacitance type, a temperature compensation type and a mixture type of the two. The insulating layer of the substrate is available in two types: a type with superior high-frequency insulation performance and a type with higher strength and superior high-frequency insulation performance. Accordingly, the present invention provides first to fourth inventions depending on the combination of the above-mentioned three types of dielectric layers and two types of insulating layers. The first invention is a combination of a dielectric layer with high capacitance and insulating layers with superior high-frequency insulation performance. The second invention is a combination of a dielectric layer with high temperature compensation performance and insulating layers with superior high-frequency insulation performance. The third invention is a combination of dielectric layers with high capacitance and high temperature compensation performance, and insulating layers with superior high-frequency insulation performance. The fourth invention is a combination of dielectric layers of the third invention and insulating layers which are strengthened by improving the insulating layers of the first to third inventions. The objects of the four inventions can be accomplished by using the following two effects common to the four inventions. Co-firing of the dielectric and insulating layers are made possible by setting the thermal expansion coefficient of the insulating layer close to that of the dielectric layer, and the firing temperature can be set lower than that of the conventional dielectric or insulating layer. In particular, the insulating layer of the fourth invention is strengthened and its firing temperature can be made lower than those of the insulating layers of the first to third inventions.

The dielectric layer commonly used in the first to fourth inventions is made of a ceramic composition mainly comprising $MTiO_3$-based ceramics described later. The insulating layer is generally made of a ceramic composition mainly comprising $MgO-SiO_2-CaO$-based ceramics. The insulating layer of the fourth invention also includes $Al_2O_3$ as the fourth component in addition to the above-mentioned three components. These insulating layers comprising the three components indicated by specific areas surrounded by lines connecting six to seven points in the ternary phase diagrams of these inventions. The further addition of $Al_2O_3$ indicates a constant additional polymerization range. The first to fourth inventions are detailed below referring to the corresponding example drawings.

BRIEF DESCRIPTION OF THE DRAWINGS

FIG. 1 is a ternary phase diagram for $MgO-SiO_2-CaO$ illustrating the composition areas of the insulating layer used in the genus invention for the multilayer substrates with inner capacitors of the first to fourth inventions;

FIG. 2 is a ternary phase diagram illustrating the composition area of the insulating layer of the first invention;

DETAILED DESCRIPTION OF THE INVENTION

Figure 3:
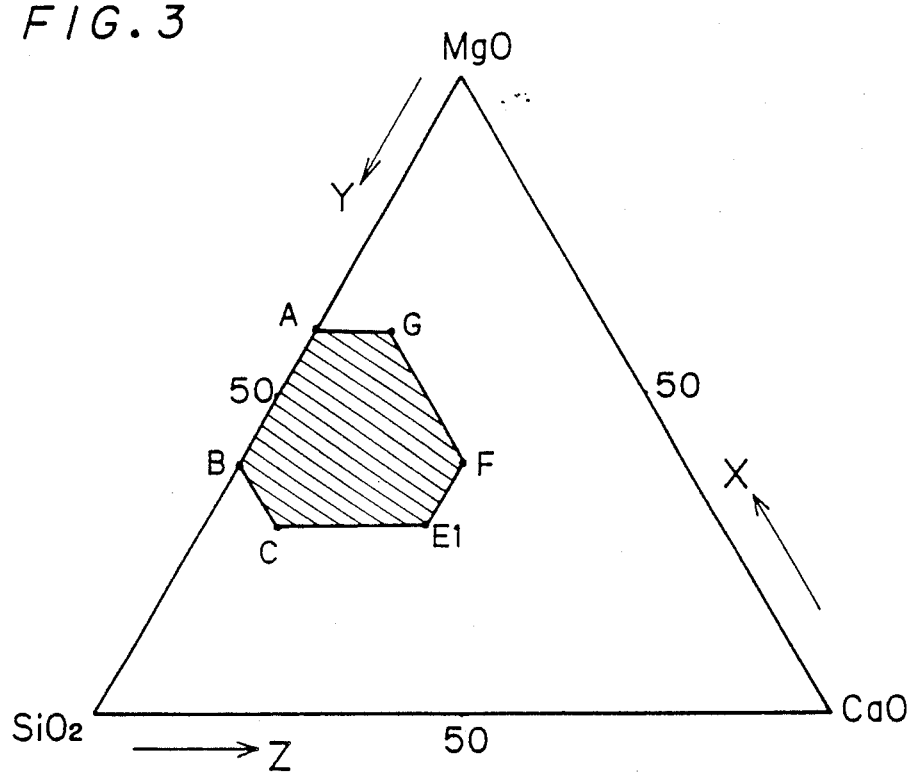
FIG. 3 is a diagram similar to FIG. 2, illustrating the composition area of the insulating layer of the second invention.

The genus invention and the first to fourth inventions are detailed below in that order. For easy understanding, the relations among the inventions, claims and drawings are generally explained below. Claim 1 and FIG. 1 that corresponds to claim 1 are applicable to all the surrounded areas of the MgO-SiO$_2$-CaO-based ceramics of the genus invention for all the inventions. Claims 2 and 4 and FIG. 2 apply to the first invention. Claims 5 to 7 and FIG. 3 apply to the second invention. Claims 8 to 10 and FIG. 4 apply to the third invention. Claims 11 to 14 and FIG. 5 apply to the fourth invention.

The genus invention is a multilayer substrate with inner capacitors comprising a dielectric layer sandwiched between an upper and lower insulating layers, a couple of printed electrodes in desired patterns within the thickness of the dielectric layer so as to form each capacitor at the portion of the dielectric layer corresponding to the electrodes, and a couple of leading terminals on one surface of the insulating layer, which communicate with the electrodes. The substrate is characterized in that the dielectric layer is composed of a ceramic composition mainly comprising MTiO$_3$-based ceramics (M represents one or several of Ba, Ca, Mg, La, Sr and Nd) and the insulating layer is composed of a ceramic material mainly comprising MgO-SiO$_2$-CaO-based ceramics, which is defined by an area surrounded by the lines connecting points A, B, C, D, E, F and G as shown in FIG. 1 and listed below, wherein X, Y and Z respectively represent weight percent values of MgO, SiO$_2$ and Cao at points A, B, C, D, E, F and G.

|   | X  | Y  | Z  |
|---|----|----|----|
| A | 60 | 40 | 0  |
| B | 40 | 60 | 0  |
| C | 30 | 60 | 10 |
| D | 30 | 50 | 20 |
| E | 20 | 50 | 30 |
| F | 40 | 30 | 30 |
| G | 60 | 30 | 10 |

For easy understanding of the genus invention, the first and fourth inventions are detailed first as described below.

The object of the first invention is to provide a multilayer substrate with inner capacitors having high electrostatic capacitance by co-firing insulating layers mainly comprising MgO-SiO$_2$-CaO-based ceramics having superior high-frequency insulation performance with a dielectric layer mainly comprising barium titanate (BaTiO$_3$) having a high dielectric constant.

More specifically, the insulating layers of the multilayer substrate with inner capacitors of the first invention, between which a capacitor section being composed of a dielectric layer mainly comprising barium titanate (BaTiO$_3$) is sandwiched, are insulating layers mainly comprising MgO-SiO$_2$-CaO-based ceramics in the area surrounded by the lines connecting points A$_1$, B$_1$, E, F and G as shown in FIG. 2. The insulating layer includes at least one crystal phase of forsterite (Mg$_2$SiO$_4$), monticellite (CaMgSiO$_4$) or akermanite (Ca$_2$MgSi$_2$O$_7$). The dielectric layer and the insulating layers, between which the capacitor section being composed of the dielectric layer portions and electrode layers are sandwiched, can be co-fired. X, Y and Z respectively represent the weight percent values of MgO, SiO$_2$ and CaO.

|     | X  | Y  | Z  |
|-----|----|----|----|
| A$_1$ | 60 | 36 | 4  |
| B$_1$ | 46 | 50 | 4  |
| E   | 20 | 50 | 30 |
| F   | 40 | 30 | 30 |
| G   | 60 | 30 | 10 |

In the composition of the above-mentioned insulating layer shown in FIG. 2, if the content of MgO exceeds 60 weight %, the firing temperature becomes 1360° C. or more. This prevents the insulating layer from being co-fired with the dielectric layer and causes MgO to deposit, reducing resistance against humidity. If the content of MgO is less than 20 weight %, the firing temperature becomes 1220° C. or less. This also prevents the insulating layer from being co-fired with the dielectric layer.

If the content of SiO$_2$ exceeds 50 weight %, the thermal expansion coefficient of the insulating layer reduces. Due to the difference in thermal expansion coefficient between the insulating layer and the dielectric layer, cracks are caused in the dielectric layer and the predetermined dielectric characteristics cannot be obtained. If the content of SiO$_2$ is less than 30 weight %, the firing temperature becomes 1360° C. or more. This prevents the insulating layer from being co-fired with the dielectric layer.

If the content of CaO exceeds 30 weight % or is less than 4 weight %, the reactivity of CaO with the ceramics comprising barium titanate becomes significantly high. This prevents generation of any dielectric layer having the predetermined characteristics. If the content of CaO exceeds 30 weight %, calcium silicate, such as CaSiO$_3$ or Ca$_2$SiO$_4$, deposits, thereby reducing the resistance against humidity.

Therefore, the composition of the above-mentioned insulating layer is restricted within the area surrounded by the lines connecting points A$_1$, B$_1$, E, F and G as shown in FIG. 2.

By making adjustment so that the main components, MgO, SiO$_2$ and CaO, of the insulating layers, between which the capacitor section is sandwiched, are within the area surrounded by the lines connecting points A$_1$, B$_1$, E, F and G as shown in FIG. 2, the insulating material can be co-fired with the dielectric material comprising barium titanate (BaTiO$_2$) at 1240° to 1340° C. (the firing temperature range of the dielectric material). In addition to the crystal phase of forsterite, at least one crystal phase of monticellite (CaMgSiO$_4$) or akermanite (Ca$_2$MgSi$_2$O$_7$) is formed. The thermal expansion coefficients of the latter two crystal phases differ from that of the crystal phase of forsterite.

EXAMPLE 1

The multilayer substrate with inner capacitors of the first invention is detailed below taking an example shown in FIG. 6.

Figure 6:
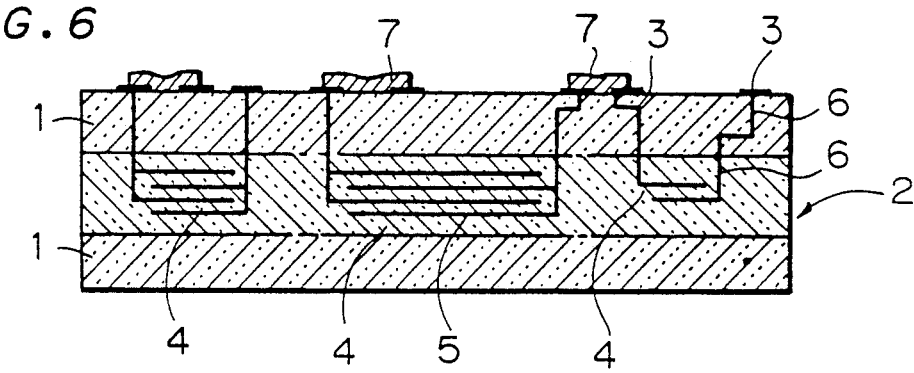
FIG. 6 is a cross section of a circuit substrate common to the first and second inventions.

FIG. 6 is a cross section of an example of a multilayer substrate common to the first and second inventions.

Referring to FIG. 6, numeral 1 represents a insulating layer, numeral 2 represents a capacitor section, numeral 3 represents an electric wiring conductor. The capacitor section 2 is composed of dielectric layer portions 4 and electrode layers 5 laminated alternately.

The insulating layer 1 is made by mixing ceramic material powder comprising MgO, $SiO_2$ and CaO so that its composition is within the area surrounded by the lines connecting points $A_1$, $B_1$, E, F and G as shown in FIG. 2 and by calcining the mixture at 1100° to 1300° C. The calcined substance is pulverized into ceramic powder and mixed with appropriate organic binders, dispersing agents, plasticizers and solvents to form slurry. The slurry is processed into a sheet by a known method such as the doctor blade method. A plurality of the green sheets are laminated to form the insulating layer 1.

The capacitor section 2 is made as follows: the dielectric material powder mainly comprising $BaTiO_3$ is mixed with appropriate organic binders, dispersing agents, plasticizers and solvents to form slurry. The slurry is processed into a sheet by a known method such as the slip cast method. On the obtained dielectric green sheet, silver-palladium (Ag-Pd) alloy paste for example and mixed with appropriate solvents is printed by the screen printing method according to the predetermined electrode patterns to form the electrode layer 5. To obtain continuity between the top and bottom surfaces of the insulating layer 1 and capacitor section 2, through-hole sections 6 are formed by punching the green sheets of the insulating and dielectric layers. In the through-hole section 6, the above-mentioned alloy paste is filled.

The above-mentioned green sheets of the insulating and dielectric layers are respectively laminated and pressed at heating. The obtained laminations are subjected to a binder burnout process at 200° to 400° C., then co-fired at 1240° to 1340° C. As a result, a multilayer substrate with the inner capacitor section 2 is obtained.

Electric wiring conductor patterns are formed using Ag-Pd-based alloy paste on the surface of the fired insulating layer 1 by the screen printing method. When required, resistor patterns are formed using paste mainly comprising ruthenium oxide ($RuO_2$) by the screen printing method. The substrate is then fired at about 850° C. in the air to obtain a multilayer substrate with inner capacitors and resistors 7.

When using paste mainly comprising copper (Cu) for the electric wiring conductor patterns, paste mainly comprising lanthanum boride ($LaB_6$) and stannic oxide ($SnO_2$) is applied by printing to form resistor patterns. The resistor patterns are then various setting capacitance values can be set. The sheets are then punched and formed to dielectric sheets of 170 mm square.

On the dielectric sheets, Ag-Pd alloy paste is applied by a thick-film printing method such as the screen printing method to form electrode patterns of about 1 to 10 mm square depending on the required electrostatic capacitance.

The through-hole sections formed in the insulating and dielectric sheets are filled with the Ag-Pd alloy paste by the screen printing method.

A plurality of the dielectric sheets comprising barium titanate are sandwiched between the insulating sheets and pressed at heating. The obtained laminations are subjected to a binder burnout process at 200° to 400° C. and fired in the air at the temperatures listed in Table 1.

The evaluation samples made described above were checked for short-circuit between the electrode layers of the capacitor section using an LCR meter. The electrostatic capacitance of the capacitor section was measured at a frequency of 1 kHz and at an input signal level of 1.0 Vrms using the LCR fired at about 900° C. in an atmosphere of nitrogen. As a result, a multilayer substrate with inner capacitors similar to that described above is obtained.

The first invention is detailed further taking an example of the first invention and a contrast example excluded from the scope of first invention.

Various types of ceramic material powder comprising MgO, $SiO_2$ and CaO are mixed and calcined at 1100° to 1300° C. so that the composition of the insulating layer has the ratios listed in Table 1. The calcined substance is pulverized to obtain the desired particle size. Appropriate organic binders and solvents are then added to the obtained material powder to form slurry. The slurry is processed by the doctor blade method to form a green sheet of 200 μm in thickness. The green sheet is then punched to obtain insulating sheets of 170 mm square.

The ceramic material powder mainly comprising barium titanate ($BaTiO_3$) is mixed with appropriate binders and solvents added to form slurry. The slurry is processed by the slip cast method to form green sheets of 20 to 60 μm in thickness so that meter according to the JIS C 5102 standards. Relative permittivity ($\epsilon_r$) was calculated from the electrostatic capacitance. The electrostatic capacitance values were measured between −55° C. and 125° C. The change ratio of the electrostatic capacitance values were calculated as temperature coefficients (TCC). The insulation resistance value of the capacitor section was measured 60 seconds after 25 V DC was applied. The dielectric breakdown voltage of the capacitor section was measured as the voltage value obtained in a moment the leak current value exceeded 1.0 mA while voltage was applied across the terminals of the capacitor section at a boosting speed of 100 V/second.

The evaluation samples were used for X-ray diffraction of the crystal phase of the insulating layer. The crystal phase was identified according to the X-ray diffraction pattern on the surface of the evaluation sample. The thermal expansion coefficients of the insulating and dielectric layers were obtained by measuring the average thermal expansion coefficients in the temperature range between 40° and 800° C. using square rod test pieces (in a square rod form) measuring 3×3×40 mm, having the same compositions as those of the corresponding evaluation samples and co-fired with the evaluation samples. Table 1 indicates the results of the measurements.

TABLE 1

| | Insulating layer | | | | | |
|---|---|---|---|---|---|---|
| | Composition (weight %) | | | Firing temperature (°C.) | Thermal expansion coefficient 40~800° C. (1/°C. × $10^{-6}$) | Crystal phase |
| Sample No. | MgO | $SiO_2$ | CaO | | | |
| *1 | 62 | 34 | 4 | 1400 | 12.1 | $Mg_2SiO_4$, MgO |
| *2 | 62 | 28 | 10 | 1400 | 12.2 | $Mg_2SiO_4$, MgO |
| *3 | 60 | 38 | 2 | 1360 | 11.8 | $Mg_2SiO_4$, MgO |
| 4 | 60 | 36 | 4 | 1340 | 11.8 | $Mg_2SiO_4$, $CaMgSiO_4$ |
| 5 | 60 | 30 | 10 | 1320 | 11.9 | $Mg_2SiO_4$, $CaMgSiO_4$ |
| 6 | 56 | 40 | 4 | 1280 | 11.7 | $Mg_2SiO_4$, $Ca_2MgSi_2O_7$ |
| 7 | 56 | 34 | 10 | 1260 | 11.7 | $Mg_2SiO_4$, $CaMgSiO_4$, $Ca_2MgSi_2O_7$ |
| 8 | 50 | 46 | 4 | 1240 | 11.5 | $Mg_2SiO_4$, $Ca_2MgSi_2O_7$ |
| 9 | 50 | 40 | 10 | 1240 | 11.7 | $Mg_2SiO_4$, $CaMgSiO_4$, $Ca_2MgSi_2O_7$ |
| 10 | 50 | 34 | 16 | 1240 | 11.8 | $Mg_2SiO_4$, $CaMgSiO_4$, $Ca_2MgSi_2O_7$ |
| 11 | 50 | 30 | 20 | 1280 | 11.8 | $Mg_2SiO_4$, $CaMgSiO_4$, $Ca_2MgSi_2O_7$ |
| *12 | 50 | 28 | 22 | 1360 | 11.9 | $Mg_2SiO_4$, $CaMgSiO_4$, $Ca_2MgSi_2O_7$ |
| *13 | 48 | 50 | 2 | 1300 | 10.8 | $Mg_2SiO_4$, $MgSiO_3$ |
| 14 | 46 | 50 | 4 | 1280 | 11.3 | $Mg_2SiO_4$, $Ca_2MgSi_2O_7$ |
| 15 | 46 | 44 | 10 | 1260 | 11.5 | $Mg_2SiO_4$, $Ca_2MgSi_2O_7$, $CaMgSiO_4$ |
| 16 | 46 | 40 | 14 | 1240 | 11.7 | $Mg_2SiO_4$, $Ca_2MgSi_2O_7$, $CaMgSiO_4$ |
| 17 | 46 | 34 | 20 | 1250 | 11.8 | $Mg_2SiO_4$, $Ca_2MgSi_2O_7$, $CaMgSiO_4$ |
| *18 | 44 | 52 | 4 | 1240 | 10.8 | $Mg_2SiO_4$, $MgSiO_3$ |
| 19 | 40 | 44 | 16 | 1260 | 11.6 | $Mg_2SiO_4$, $CaMgSiO_4$, $Ca_2MgSi_2O_7$ |
| 20 | 40 | 40 | 20 | 1260 | 11.8 | $Mg_2SiO_4$, $CaMgSiO_4$, $Ca_2MgSi_2O_7$ |
| 21 | 40 | 34 | 26 | 1260 | 11.9 | $Mg_2SiO_4$, $CaMgSiO_4$, $Ca_2MgSi_2O_7$ |
| 22 | 40 | 30 | 30 | 1280 | 11.8 | $Mg_2SiO_4$, $CaMgSiO_4$, $Ca_2MgSi_2O_7$ |
| *23 | 40 | 28 | 32 | 1320 | 11.7 | $Mg_2SiO_4$, $CaMgSiO_4$, $Ca_2MgSi_2O_7$, MgO |
| 24 | 35 | 50 | 15 | 1280 | 11.3 | $Mg_2SiO_4$, $Ca_2MgSi_2O_7$ |
| 25 | 35 | 45 | 20 | 1280 | 11.5 | $Mg_2SiO_4$, $CaMgSiO_4$, $Ca_2MgSi_2O_7$ |
| 26 | 35 | 40 | 25 | 1260 | 11.7 | $Mg_2SiO_4$, $CaMgSiO_4$, $Ca_2MgSi_2O_7$ |
| *27 | 30 | 52 | 18 | 1240 | 10.8 | $Mg_2SiO_4$, $CaMgSi_2O_6$, $Ca_2MgSi_2O_7$ |
| 28 | 30 | 50 | 20 | 1250 | 11.3 | $Mg_2SiO_4$, $CaMgSiO_4$, $Ca_2MgSi_2O_7$ |
| 29 | 30 | 44 | 26 | 1250 | 11.5 | $Mg_2SiO_4$, $CaMgSiO_4$, $Ca_2MgSi_2O_7$ |
| 30 | 30 | 40 | 30 | 1280 | 11.6 | $Mg_2SiO_4$, $CaMgSiO_4$, $Ca_2MgSi_2O_7$ |
| *31 | 30 | 38 | 32 | 1280 | 11.7 | $Ca_2SiO_4$, $CaMgSiO_4$ |
| 32 | 20 | 50 | 30 | 1280 | 11.5 | $Mg_2SiO_4$, $CaMgSiO_4$, $Ca_2MgSi_2O_7$ |
| *33 | 18 | 52 | 30 | 1220 | 10.6 | $CaMgSi_2O_6$, $Ca_2MgSi_2O_7$ |
| *34 | 18 | 50 | 32 | 1220 | 10.8 | $CaMgSi_2O_6$, $Ca_2MgSi_2O_7$ |

| | Dielectric layer | Capacitor section | | | | |
|---|---|---|---|---|---|---|
| Sample No. | Thermal expansion coefficient 40~800° C. (1/°C. × $10^{-6}$) | Relative permittivity $\epsilon\Gamma$ | Temperature coefficient TCC (%) | Insulation resistance (Ω) | Dielectric breakdown voltage (V) | Remarks |
| *1 | 12.4 | — | — | — | — | Nonmeasurable |
| *2 | 12.4 | — | — | — | — | Nonmeasurable |
| *3 | 12.4 | 1800 | ±30 | $10^7$ | 120 | |
| 4 | 12.4 | 2500 | <±15 | >$10^{10}$ | >500 | FIG. 2, A1 |
| 5 | 12.4 | 2500 | <±15 | >$10^{10}$ | >500 | FIG. 2, G |
| 6 | 12.4 | 2500 | <±15 | >$10^{10}$ | >500 | |
| 7 | 12.4 | 2500 | <±15 | >$10^{10}$ | >500 | |
| 8 | 12.4 | 2500 | <±15 | >$10^{10}$ | >500 | |
| 9 | 12.4 | 2500 | <±15 | >$10^{10}$ | >500 | |
| 10 | 12.4 | 2500 | <±15 | >$10^{10}$ | >500 | |
| 11 | 12.4 | 2500 | <±15 | >$10^{10}$ | >500 | |
| *12 | 12.4 | 1900 | ±35 | $10^8$ | 250 | |
| *13 | 12.4 | 1950 | ±20 | $10^7$ | 80 | |
| 14 | 12.4 | 2500 | <±15 | >$10^{10}$ | >500 | FIG. 2, B1 |
| 15 | 12.4 | 2500 | <±15 | >$10^{10}$ | >500 | |
| 16 | 12.4 | 2500 | <±15 | >$10^{10}$ | >500 | |
| 17 | 12.4 | 2500 | <±15 | >$10^{10}$ | >500 | |
| *18 | 12.4 | 2100 | ±25 | $10^8$ | 150 | |
| 19 | 12.4 | 2500 | <±15 | >$10^{10}$ | >500 | |
| 20 | 12.4 | 2500 | <±15 | >$10^{10}$ | >500 | |
| 21 | 12.4 | 2500 | <±15 | >$10^{10}$ | >500 | |
| 22 | 12.4 | 2500 | <±15 | >$10^{10}$ | >500 | FIG. 2, F |
| *23 | 12.4 | 1800 | ±30 | $10^7$ | 300 | |
| 24 | 12.4 | 2500 | <±15 | >$10^{10}$ | >500 | |
| 25 | 12.4 | 2500 | <±15 | >$10^{10}$ | >500 | |
| 26 | 12.4 | 2500 | <±15 | >$10^{10}$ | >500 | |
| *27 | 12.4 | 1800 | ±25 | $10^8$ | 140 | |
| 28 | 12.4 | 2500 | <±15 | >$10^{10}$ | >500 | |
| 29 | 12.4 | 2500 | <±15 | >$10^{10}$ | >500 | |
| 30 | 12.4 | 2500 | <±15 | >$10^{10}$ | >500 | |
| *31 | 12.4 | 2300 | ±20 | $10^9$ | >500 | |
| 32 | 12.4 | 2500 | <±15 | >$10^{10}$ | >500 | FIG. 2, E |
| *33 | 12.4 | 2300 | ±25 | $10^8$ | >500 | |

TABLE 1-continued

| *34 | 12.4 | 2300 | ±25 | $10^9$ | 110 |

Samples identified by the numbers marked * are excluded from the scope of the claims of the present invention.

With the multilayer substrate with inner capacitors of the first invention, the insulating layer mainly comprising magnesia, silica and calcia, and being superior in high-frequency insulation performance can be co-fired with the dielectric material mainly comprising barium titanate without causing reaction between the two. In addition, the thermal expansion coefficient of the insulating layer can be set very close to that of the dielectric layer as shown in Table 1. The inner capacitor section can thus have high electrostatic capacitance, insulation resistance and dielectric breakdown voltage without causing cracks in the dielectric layer. As a result, the invention can offer a multilayer substrate with inner capacitors that is miniaturized and high in density, ideally suited for hybrid substrates for example.

The object of the second invention is to provide a multilayer substrate with inner capacitors having stable various characteristics as temperature compensation capacitors, wherein insulating layers mainly comprising MgO and $SiO_2$ or MgO, $SiO_2$ and CaO and having superior high-frequency insulation performance can be co-fired with a dielectric material for temperature compensation. More specifically, the insulating layers of the multilayer substrate with inner capacitors of the second invention, between which a capacitor section mainly comprising a dielectric ceramics for temperature compensation is sandwiched, are insulating layers mainly comprising magnesia (MgO) and silica ($SiO_2$) or magnesia (MgO), silica ($SiO_2$) and calcia (CaO) in the area surrounded by the lines connecting points A, B, C, $E_1$, F and G shown in FIG. 3. The insulating layer includes at least one crystal phase of forsterite ($Mg_2SiO_4$), monticellite ($CaMgSiO_4$) or akermanite ($Ca_2MgSi_2O_7$). The dielectric layer and the insulating layers, between which the capacitor section being composed of the dielectric layer portions and electrode layers are sandwiched, can be co-fired. X, Y and Z respectively represent the weight percent values of magnesia (MgO), silica ($SiO_2$) and calcia (CaO).

|   | X  | Y  | Z  |
|---|----|----|----|
| A | 60 | 40 | 0  |
| B | 40 | 60 | 0  |
| C | 30 | 60 | 10 |
| $E_1$ | 30 | 40 | 30 |
| F | 40 | 30 | 30 |
| G | 60 | 30 | 10 |

In the composition of the above-mentioned insulating layer shown in FIG. 3, if the content of MgO exceeds 60 weight %, the firing temperature becomes 1400° C. or more. This prevents the insulating layer from being co-fired with the dielectric layer for temperature compensation. If the content of MgO is less than 30 weight %, the insulation resistance value and dielectric breakdown voltage reduce beyond their practical ranges.

If the content of $SiO_2$ exceeds 60 weight %, the thermal expansion coefficient of the insulating layer reduces. Due to the difference in thermal expansion coefficient between the insulating layer and the dielectric layer for temperature compensation, cracks are caused in the dielectric layer for temperature compensation and the insulation resistance value and dielectric breakdown voltage reduce beyond their practical ranges. If the content of $SiO_2$ is less than 30 weight %, the firing temperature becomes 1400° C. or more. This prevents the insulating layer from being co-fired with the dielectric layer for temperature compensation.

If the content of CaO exceeds 30 weight %, the firing temperature becomes 1400° C. or more. This prevents the insulating layer from being co-fired with the dielectric layer for temperature compensation. Even if they can be co-fired, calcium silicate, such as $CaSiO_3$ or $Ca_2SiO_4$ deposits, thereby reducing the insulation resistance value and dielectric breakdown voltage beyond their practical ranges.

Therefore, the composition of the above-mentioned insulating layer is restricted within the area surrounded by the lines connecting points A, B, C, $E_1$, F and G as shown in FIG. 3.

By making adjustment so that the main components, MgO and $SiO_2$ or MgO, $SiO_2$ and CaO of the insulating layers, between which the capacitor section is sandwiched, are within the area surrounded by the lines connecting points A, B, C, $E_1$, F and G as shown in FIG. 3, the insulating material can be co-fired with the dielectric material for temperature compensation mainly comprising calcium titanate ($CaTiO_3$), magnesium titanate ($MgTiO_4$), lanthanum titanate ($La_2Ti_2O_7$), strontium titanate ($SrTiO_3$) or neodymium titanate ($Nd_2Ti_2O_7$) at 1240° to 1340° C. (the firing temperature range of the dielectric material. In addition to the crystal phase of forsterite ($Mg_2SiO_4$), at least one crystal phase of enstatite ($MgSiO_3$), monticellite ($CaMgSiO_4$) or akermanite ($Ca_2MgSi_2O_7$) is formed in the fired insulating layer. The thermal expansion coefficients of the three crystal phases differ from that of the crystal phase of forsterite. The thermal expansion coefficient of the insulating layer can thus be adjusted.

EXAMPLE 2

The multilayer substrate with inner capacitors of the second invention is detailed below taking an example shown in FIG. 6.

FIG. 6 is a cross section of an example of a multilayer substrate of the second invention. Since the structure of the multilayer substrate is the same as that of the first invention, the explanation of the structure is omitted.

|   | X  | Y  | Z  |
|---|----|----|----|
| A | 60 | 40 | 0  |
| B | 40 | 60 | 0  |
| C | 30 | 60 | 10 |
| $E_1$ | 30 | 40 | 30 |
| F | 40 | 30 | 30 |
| G | 60 | 30 | 10 |

X, Y and Z respectively represent weight percent values of magnesia (MgO), silica ($SiO_2$) and calcia (CaO).

The insulating layer 1 is made by mixing ceramic material powder comprising MgO and $SiO_2$ or MgO and $SiO_2$ and CaO so that its composition is within the area surrounded by the lines connecting points A, B, C, $E_1$, F and G as shown in FIG. 3 and by calcining the mixture at 1100° to 1300° C. The calcined substance is pulverized into ceramic powder and mixed with appropriate organic binders, dispersing agents, plasticizers and solvents to form slurry. The slurry is processed into green sheets by a known method such as the doctor blade method. A plurality of the green sheets are laminated to form the insulating layer 1.

The capacitor section 2 is made as follows: the dielectric material powder for temperature compensation mainly comprising $CaTiO_3$, $Mg_2TiO_4$, $La_2Ti_2O_7$, $SrTiO_3$ or $Nd_2Ti_2O_7$ is mixed with appropriate organic binders, dispersing agents, plasticizers and solvents to form slurry. The slurry is processed into green sheets by a known method such as the slip cast method. On the obtained dielectric green sheet, silver-palladium (Ag-Pd) alloy paste for example and mixed with appropriate solvents is printed by the screen printing method according to the predetermined electrode patterns to form the electrode layer 5.

To obtain continuity between the top and bottom surfaces of the insulating layer 1 and capacitor section 2, through-hole sections 6 are formed by punching the green sheets of the insulating and dielectric layers. In the through-hole sections 6, the above-mentioned alloy paste is filled.

The above-mentioned green sheets of the insulating and dielectric layers are laminated and pressed at heating respectively. The obtained laminations are subjected to a binder burnout process at 200° to 400° C., then co-fired at 1240° to 1340° C. As a result, a multilayer substrate with the inner capacitor section 2 is obtained.

By the screen printing method, other electric wiring conductor patterns are formed using Ag-Pd-based alloy paste on the surface of the fired insulating layer 1. When required, resistor patterns are formed using paste mainly comprising ruthenium oxide ($RuO_2$) by the screen printing method. The obtained substance is then fired at about 850° C. in the air to obtain a multilayer substrate with inner capacitors and resistors 7.

When using paste mainly comprising copper (Cu) for the electric wiring conductor patterns, paste mainly comprising lanthanum boride ($LaB_6$) and stannic oxide ($SnO_2$) is applied by printing to form resistor patterns. The resistor patterns are then fired at about 900° C. in an atmosphere of nitrogen. As a result, a multilayer substrate with inner capacitors similar to that described above is obtained.

The second invention is detailed further taking an example of the second invention and a contrast example.

Various types of ceramic material powder comprising MgO and $SiO_2$ or MgO and $SiO_2$ and CaO are mixed so that the composition of the insulating layer has the ratios indicated in Table 2 and calcined at 1100° to 1300° C. The calcined substance is pulverized to obtain the desired particle size. Appropriate organic binders and solvents are then added to the obtained material powder to form slurry. The slurry is processed by the doctor blade method to form a green sheet of 200 μm in thickness. The green sheet is then punched to obtain insulating sheets of 170 mm square.

The ceramic material powder mainly comprising the dielectric material for temperature compensation indicated in Table 2 is mixed with appropriate binder and solvent added to form slurry. The slurry is processed by the slip cast method to form green sheets of 20 to 60 μm in thickness so that various capacitance values can be set. The sheets are then punched and formed to dielectric sheets of 170 mm square.

On the dielectric sheets, Ag-Pd alloy paste is applied by a thick-film printing method such as the screen printing method to form electrode patterns of about 1 to 10 mm square depending on the required electrostatic capacitance.

The through-hole sections formed in the insulating and dielectric sheets are filled with the Ag-Pd alloy paste by the screen printing method.

A plurality of the dielectric sheets are sandwiched between the insulating sheets and pressed at heating. The obtained laminations are subjected to a binder burnout process at 200° to 400° C. in the air and fired in the air at the temperatures indicated in Table 2.

The evaluation samples made described above were checked for short-circuit between the electrode layers of the capacitor section using an LCR meter. The electrostatic capacitance of the capacitor section was then measured at a frequency of 1 kHz, at an input signal level of 1.0 Vrms and at −55° C. to 125° C. using the LCR meter according to the JIS C 5102 standards. The change ratios of the electrostatic capacitance values were calculated as temperature coefficients (TCC). In the same way, the resistance value of the capacitor section was measured 60 seconds after 25 V DC was applied to the capacitor section. The resistance value was assumed as the insulation resistance value of the capacitor section. Voltage was also applied across the terminals of the capacitor section at a boosting speed of 100 V/second and the voltage value obtained in a moment the leak current value exceeded 1.0 mA was measured. The voltage value was assumed as the dielectric breakdown voltage of the capacitor section.

The evaluation samples were used for X-ray diffraction of the crystal phase of the insulating layer. The crystal phase was identified according to the X-ray diffraction pattern on the surface of each evaluation sample. The thermal expansion coefficients of the insulating and dielectric layers were obtained by measuring the average thermal expansion coefficients in the temperature range between 40° and 800° C. using square rod test pieces measuring 3×3×40 mm and having the same compositions as those of the corresponding evaluation samples and were fired when the above-mentioned evaluation samples were fired.

Table 2 indicates the results of the measurements.

TABLE 2

| | Insulating layer | | | | | Dielectric layer for temperature compensation Dielectric material |
|---|---|---|---|---|---|---|
| | Composition (weight %) | | | Firing temperature | Thermal expansion coefficient 40~800° C. | |
| Sample No. | MgO | $SiO_2$ | CaO | (°C.) | (1/°C. × $10^{-6}$) | Crystal phase | (main component) |
| *1 | 62 | 28 | 10 | 1420 | 12.4 | $Mg_2SiO_4$, MgO | $CaTiO_3$ |
| *2 | 62 | 28 | 10 | 1420 | 12.4 | $Mg_2SiO_4$, MgO | $Mg_2TiO_4$ |
| *3 | 62 | 38 | 0 | 1400 | 11.8 | $Mg_2SiO_4$, MgO | $CaTiO_3$ |
| *4 | 60 | 38 | 0 | 1400 | 11.8 | $Mg_2SiO_4$, MgO | $Mg_2TiO_4$ |

TABLE 2-continued

| Sample No. | | | | Firing temp | Thermal exp. | Crystalline phases | Last col |
|---|---|---|---|---|---|---|---|
| 5 | 60 | 30 | 10 | 1340 | 11.6 | Mg₂SiO₄,Ca₂MgSi₂O₇ | CaTiO₃ |
| 6 | 60 | 30 | 10 | 1340 | 11.6 | Mg₂SiO₄,Ca₂MgSi₂O₇ | Mg₂TiO₄ |
| 7 | 60 | 40 | 0 | 1320 | 11.7 | Mg₂SiO₄ | CaTiO₃ |
| 8 | 60 | 40 | 0 | 1320 | 11.7 | Mg₂TiO₄ | Mg₂TiO₄ |
| 9 | 55 | 35 | 10 | 1280 | 11.6 | Mg₂SiO₄,Ca₂MgSi₂O₇ | CaTiO₃ |
| 10 | 55 | 35 | 10 | 1280 | 11.6 | Mg₂SiO₄,Ca₂MgSi₂O₇ | Mg₂TiO₄ |
| 11 | 55 | 35 | 10 | 1280 | 11.6 | Mg₂SiO₄,Ca₂MgSi₂O₇ | La₂Ti₂O₇ |
| 12 | 55 | 35 | 10 | 1280 | 11.6 | Mg₂SiO₄,Ca₂MgSi₂O₇ | SrTiO₃ |
| 13 | 55 | 35 | 10 | 1280 | 11.6 | Mg₂SiO₄,Ca₂MgSi₂O₇ | Nd₂Ti₂O₇ |
| 14 | 55 | 40 | 5 | 1280 | 11.6 | Mg₂SiO₄,Ca₂MgSi₂O₇ | CaTiO₃ |
| 15 | 55 | 40 | 5 | 1300 | 11.6 | Mg₂SiO₄,Ca₂MgSi₂O₇ | Mg₂TiO₄ |
| 16 | 55 | 40 | 5 | 1260 | 11.6 | Mg₂SiO₄,Ca₂MgSi₂O₇ | La₂Ti₂O₇ |
| 17 | 55 | 40 | 5 | 1280 | 11.6 | Mg₂SiO₄,Ca₂MgSi₂O₇ | SrTiO₃ |
| 18 | 55 | 40 | 5 | 1260 | 10.6 | Mg₂SiO₄,Ca₂MgSi₂O₇ | Nd₂Ti₂O₇ |
| *19 | 52 | 28 | 20 | 1420 | 11.8 | Mg₂SiO₄,MgO | La₂Ti₂O₇ |
| 20 | 45 | 35 | 20 | 1280 | 11.9 | Mg₂SiO₄,CaOMgOSiO₄, Ca₂MgSi₂O₇ | CaTiO₃ |
| 21 | 45 | 35 | 20 | 1280 | 11.9 | Mg₂SiO₄,CaOMgOSiO₄, Ca₂MgSi₂O₇ | Mg₂TiO₄ |
| 22 | 45 | 35 | 20 | 1280 | 11.9 | Mg₂SiO₄,CaOMgOSiO₄, Ca₂MgSi₂O₇ | La₂Ti₂O₇ |
| 23 | 45 | 35 | 20 | 1280 | 11.9 | Mg₂SiO₄,CaOMgOSiO₄, Ca₂MgSi₂O₇ | SrTiO₃ |
| 24 | 45 | 35 | 20 | 1280 | 11.9 | Mg₂SiO₄,CaOMgOSiO₄, Ca₂MgSi₂O₇ | Nd₂Ti₂O₇ |
| 25 | 45 | 50 | 5 | 1300 | 11.5 | Mg₂SiO₄,MgSiO₃, CaMgSiO₄ | CaTiO₃ |
| 26 | 45 | 50 | 5 | 1300 | 11.5 | Mg₂SiO₄,MgSiO₃, CaMgSiO₄ | Mg₂TiO₄ |
| 27 | 45 | 50 | 5 | 1300 | 11.5 | Mg₂SiO₄,MgSiO₃, CaMgSiO₄ | La₂Ti₂O₇ |
| 28 | 45 | 50 | 5 | 1300 | 11.5 | Mg₂SiO₄,MgSiO₃, CaMgSiO₄ | SrTiO₃ |
| 29 | 45 | 50 | 5 | 1300 | 11.5 | Mg₂SiO₄,MgSiO₃, CaMgSiO₄ | Nd₂Ti₂O₇ |
| *30 | 40 | 28 | 32 | 1400 | 11.7 | Mg₂SiO₄,CaMgSiO₄ MgO,CaSiO₃ | CaTiO₃ |
| *31 | 40 | 28 | 32 | 1400 | 11.7 | Mg₂SiO₄,CaMgSiO₄ MgO,CaSiO₃ | Mg₂TiO₄ |
| 32 | 40 | 30 | 30 | 1300 | 11.5 | Mg₂SiO₄,CaMgSiO₄ | CaTiO₃ |
| 33 | 40 | 30 | 30 | 1280 | 11.5 | Mg₂SiO₄,CaMgSiO₄ | Mg₂TiO₄ |
| 34 | 40 | 50 | 10 | 1260 | 11.2 | Mg₂SiO₄,MgSiO₃, Ca₂MgSi₂O₇ | CaTiO₃ |
| 35 | 40 | 50 | 10 | 1280 | 11.2 | Mg₂SiO₄,MgSiO₃, Ca₂MgSi₂O₇ | Mg₂TiO₄ |
| 36 | 40 | 50 | 10 | 1240 | 11.2 | Mg₂SiO₄,MgSiO₃, Ca₂MgSi₂O₇ | La₂TiO₄ |
| 37 | 40 | 50 | 10 | 1280 | 11.2 | Mg₂SiO₄,MgSiO₃, Ca₂MgSi₂O₇ | SrTiO₃ |
| 38 | 40 | 50 | 10 | 1240 | 11.2 | Mg₂SiO₄,MgSiO₃, Ca₂MgSi₂O₇ | Nd₂Ti₂O₇ |
| 39 | 40 | 60 | 0 | 1320 | 11.5 | Mg₂SiO₄ | CaTiO₃ |
| 40 | 40 | 60 | 0 | 1320 | 11.5 | Mg₂SiO₄ | Mg₂TiO₄ |
| 41 | 38 | 40 | 22 | 1240 | 11.8 | Mg₂SiO₄,CaMgSiO₄, Ca₂MgSi₂O₇ | CaTiO₃ |
| 42 | 38 | 40 | 22 | 1280 | 11.8 | Mg₂SiO₄,CaMgSiO₄, Ca₂MgSi₂O₇ | Mg₂TiO₄ |
| 43 | 38 | 40 | 22 | 1260 | 11.8 | Mg₂SiO₄,CaMgSiO₄, Ca₂MgSi₂O₇ | La₂Ti₂O₇ |
| 44 | 38 | 40 | 22 | 1280 | 11.8 | Mg₂SiO₄,CaMgSiO₄, Ca₂MgSi₂O₇ | SrTiO₃ |
| 45 | 38 | 40 | 22 | 1240 | 11.8 | Mg₂SiO₄,CaMgSiO₄, Ca₂MgSi₂O₇ | Nd₂Ti₂O₇ |
| 46 | 38 | 52 | 10 | 1260 | 11.2 | Mg₂SiO₄,MgSiO₃, Ca₂MgSi₂O₇ | CaTiO₃ |
| 47 | 38 | 52 | 10 | 1260 | 11.2 | Mg₂SiO₄,MgSiO₃, Ca₂MgSi₂O₇ | Mg₂TiO₄ |
| 48 | 38 | 52 | 10 | 1260 | 11.2 | Mg₂SiO₄,MgSiO₃, Ca₂MgSi₂O₇ | La₂Ti₂O₇ |
| 49 | 38 | 52 | 10 | 1260 | 11.2 | Mg₂SiO₄,MgSiO₃, Ca₂MgSi₂O₇ | SrTiO₃ |
| 50 | 38 | 52 | 10 | 1260 | 11.2 | Mg₂SiO₄,MgSiO₃, Ca₂MgSi₂O₇ | Nd₂Ti₂O₇ |
| *51 | 38 | 62 | 0 | 1280 | 10.0 | MgSiO₃ | CaTiO₃ |
| *52 | 30 | 62 | 0 | 1280 | 10.0 | MgSiO₃ | Mg₂TiO₄ |
| 53 | 30 | 40 | 30 | 1340 | 11.4 | Mg₂SiO₄,CaMgSiO₄, Ca₂MgSi₂O₇ | CaTiO₃ |
| 54 | 30 | 40 | 30 | 1340 | 11.4 | Mg₂SiO₄,CaMgSiO₄, Ca₂MgSi₂O₇ | Mg₂TiO₄ |
| 55 | 30 | 60 | 10 | 1320 | 10.4 | MgSiO₃, Mg₂SiO₄ | CaTiO₃ |
| 56 | 30 | 60 | 10 | 1320 | 10.4 | MgSiO₃, Mg₂SiO₄ | Mg₂TiO₄ |
| *57 | 28 | 40 | 32 | 1360 | 11.3 | Mg₂SiO₄,Ca₂SiO₄, Ca₂MgSi₂O₇ | CaTiO₃ |
| *58 | 28 | 40 | 32 | 1360 | 11.3 | Mg₂SiO₄,Ca₂SiO₄, Ca₂MgSi₂O₇ | Mg₂TiO₄ |
| *59 | 28 | 50 | 22 | 1300 | 9.8 | Mg₂SiO₄,CaMgSi₂O₆ | CaTiO₃ |
| *60 | 28 | 50 | 22 | 1300 | 9.8 | Mg₂SiO₄,CaMgSi₂O₆ | Mg₂TiO₄ |
| *61 | 28 | 62 | 10 | 1350 | 9.5 | MgSiO₃,CaMgSi₂O₆ | CaTiO₃ |
| *62 | 28 | 62 | 10 | 1350 | 9.5 | MgSiO₃,CaMgSi₂O₆ | Mg₂TiO₄ |

| | Dielectric layer for temperature compensation | Capacitor section | | | |
|---|---|---|---|---|---|
| Sample No. | Thermal expansion coefficient 40~800° C. (1/°C. × 10⁻⁶) | Temperature coefficient TCC (ppm/°C.) | Insulation resistance (Ω) | Dielectric breakdown voltage (V) | Remarks |
| *1 | 11.5 | — | — | — | Nonmeasurable |
| *2 | 10.5 | — | — | — | Nonmeasurable |
| *3 | 11.5 | — | — | — | Nonmeasurable |
| *4 | 10.5 | — | — | — | Nonmeasurable |
| 5 | 11.5 | N740 | >10¹² | >1500 | FIG. 3, G |
| 6 | 10.5 | N3 | >10¹² | >1500 | " |
| 7 | 11.5 | N755 | >10¹² | >1500 | FIG. 3, A |
| 8 | 10.5 | N3 | >10¹² | >1500 | " |
| 9 | 11.5 | N750 | >10¹² | >1500 | |
| 10 | 10.5 | N4 | >10¹² | >1500 | |
| 11 | 11.0 | N4 | >10¹² | >1500 | |
| 12 | 11.0 | N2200 | >10¹² | >1500 | |

TABLE 2-continued

| | | | | | |
|---|---|---|---|---|---|
| 13 | 10.7 | P4 | >$10^{12}$ | >1500 | |
| 14 | 11.5 | N750 | >$10^{12}$ | >1500 | |
| 15 | 10.5 | N6 | >$10^{12}$ | >1500 | |
| 16 | 11.0 | N4 | >$10^{12}$ | >1500 | |
| 17 | 11.0 | N2100 | >$10^{12}$ | >1500 | |
| 18 | 10.7 | P6 | >$10^{12}$ | >1500 | |
| *19 | 11.0 | — | — | — | Nonmeasurable |
| 20 | 11.5 | N740 | >$10^{12}$ | >1500 | |
| 21 | 10.5 | N7 | >$10^{12}$ | >1500 | |
| 22 | 11.0 | N5 | >$10^{12}$ | >1500 | |
| 23 | 11.0 | N2300 | >$10^{12}$ | >1500 | |
| 24 | 10.7 | P2 | >$10^{12}$ | >1500 | |
| 25 | 11.5 | N770 | >$10^{12}$ | >1500 | |
| 26 | 10.5 | N7 | >$10^{12}$ | >1500 | |
| 27 | 11.0 | N7 | >$10^{12}$ | >1500 | |
| 28 | 11.0 | N2200 | >$10^{12}$ | >1500 | |
| 29 | 10.7 | P2 | >$10^{12}$ | >1500 | |
| *30 | 11.5 | — | — | — | Nonmeasurable |
| *31 | 10.5 | — | — | — | Nonmeasurable |
| 32 | 11.5 | N760 | >$10^{12}$ | >1500 | FIG. 3, F |
| 33 | 10.5 | N6 | >$10^{12}$ | >1500 | FIG. 3, F |
| 34 | 11.5 | N742 | >$10^{12}$ | >1500 | |
| 35 | 10.5 | N3 | >$10^{12}$ | >1500 | |
| 36 | 11.0 | P4 | >$10^{12}$ | >1500 | |
| 37 | 11.0 | N2100 | >$10^{12}$ | >1500 | |
| 38 | 10.7 | P8 | >$10^{12}$ | >1500 | |
| 39 | 11.5 | N753 | >$10^{12}$ | >1500 | FIG. 3, B |
| 40 | 10.5 | N6 | >$10^{12}$ | >1500 | FIG. 3, B |
| 41 | 11.5 | N766 | >$10^{12}$ | >1500 | |
| 42 | 10.5 | N8 | >$10^{12}$ | >1500 | |
| 43 | 11.0 | P1 | >$10^{12}$ | >1500 | |
| 44 | 11.0 | N2200 | >$10^{12}$ | >1500 | |
| 45 | 10.7 | P5 | >$10^{12}$ | >1500 | |
| 46 | 11.5 | N740 | >$10^{12}$ | >1500 | |
| 47 | 10.5 | N5 | >$10^{12}$ | >1500 | |
| 48 | 11.0 | P2 | >$10^{12}$ | >1500 | |
| 49 | 11.0 | N2300 | >$10^{12}$ | >1500 | |
| 50 | 10.7 | P3 | >$10^{12}$ | >1500 | |
| *51 | 11.5 | N753 | $10^{10}$ | 540 | |
| *52 | 10.5 | N2 | $10^{10}$ | 600 | |
| 53 | 11.5 | N746 | >$10^{12}$ | >1500 | FIG. 3, E1 |
| 54 | 10.5 | N4 | >$10^{12}$ | >1500 | FIG. 3, E1 |
| 55 | 11.5 | N740 | >$10^{12}$ | >1500 | FIG. 3, C |
| 56 | 10.5 | N3 | >$10^{12}$ | >1500 | FIG. 3, C |
| *57 | 11.5 | N900 | $10^{11}$ | 800 | |
| *58 | 10.5 | N3 | $10^{10}$ | 1000 | |
| *59 | 11.5 | N870 | $10^{8}$ | 200 | |
| *60 | 10.5 | N1 | $10^{9}$ | 300 | |
| *61 | 11.5 | N920 | $10^{7}$ | 100 | |
| *62 | 10.5 | N2 | $10^{8}$ | 300 | |

Samples indentified by the numbers marked * are excluded from the scope of the claims of the second invention.

With the multilayer substrate with inner capacitors of the second invention, the insulating layer mainly comprising magnesia and silica or magnesia, silica and calcia being superior in high-frequency insulation performance can be co-fired with the dielectric material for temperature compensation. In addition, the thermal expansion coefficient of the insulating layer can be set very close to that of the dielectric layer. The substrate can thus include the capacitor section for temperature compensation, which is high in the insulation resistance and dielectric breakdown voltage without causing cracks in the dielectric layer. As a result, the invention can offer a multilayer substrate with inner capacitors that is miniaturized and high in density, ideally suited for hybrid substrates for example.

The object of the third invention is to provide a multilayer substrate with inner capacitors including two different types of capacitor sections: a type with high electrostatic capacitance and a type with stable temperature characteristics, wherein insulating layers mainly comprising MgO, SiO$_2$ and CaO and superior in high-frequency insulating performance can be co-fired with a dielectric material mainly comprising barium titanate (BaTiO$_3$) and having a high dielectric constant, and a dielectric material mainly comprising dielectric ceramics for temperature compensation.

Figure 4:
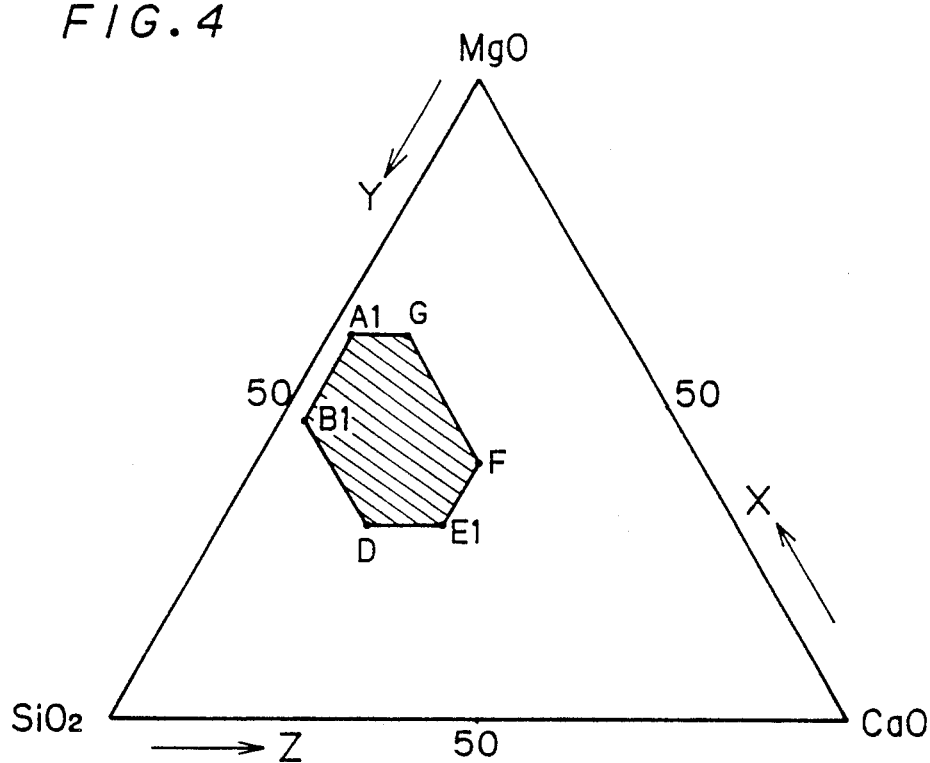
FIG. 4 is a diagram similar to FIG. 2, illustrating the composition area of the insulating layer of the third invention.

The insulating layers of the multilayer substrate with inner capacitors of the third invention, between which capacitor sections mainly composed of a dielectric material mainly comprising barium titanate (BaTiO$_3$) and dielectric ceramics for temperature compensation are sandwiched, are insulating layers mainly comprising magnesia (MgO), silica (SiO$_2$) and calcia (CaO) within the area surrounded by the lines connecting points A, B$_1$, D, E$_1$, F and G shown in FIG. 4. The insulating layer includes at least one crystal phase of forsterite (Mg$_2$SiO$_4$), merwinite (Ca$_3$MgSi$_2$O$_8$), monticellite (CaMgSiO$_4$), akermanite (Ca$_2$MgSi$_2$O$_7$) or enstatite (MgSiO$_3$). The dielectric layers and the insulating layers, between which the capacitor sections being composed of the dielectric layer portions and electrode layers are sandwiched, can be co-fired. X, Y and Z respectively represent the weight percent values of magnesia (MgO), silica (SiO$_2$) and calcia (CaO).

|  | X | Y | Z |
|---|---|---|---|
| A | 60 | 36 | 4 |
| B$_1$ | 46 | 50 | 4 |
| D | 30 | 50 | 20 |
| E$_1$ | 30 | 40 | 30 |
| F | 40 | 30 | 30 |
| G | 60 | 30 | 10 |

In the composition of the above-mentioned insulating layer shown in FIG. 4, if the content of MgO exceeds 60 weight %, the firing temperature becomes 1360° C. or more. This prevents the insulating layer from being co-fired with the two different dielectric materials, and periclase (MgO) deposits as a crystal phase, thereby reducing resistance against humidity. If the content of MgO is less than 30 weight %, the insulation resistance value and dielectric breakdown voltage reduce beyond their practical ranges.

If the content of SiO$_2$ exceeds 50 weight %, the thermal expansion coefficient of the insulating layer reduces. Due to the difference in thermal expansion coefficient between the insulating layer and the dielectric layers, cracks are caused in the dielectric layers and the predetermined dielectric characteristics cannot be obtained. If the content of SiO$_2$ is less than 30 weight %, the firing temperature becomes 1360° C. or more. This prevents the insulating layer from being co-fired with the two different dielectric layers.

If the content of CaO exceeds 30 weight %, the firing temperature becomes 1400° C. or more. This prevents the insulating layer from being co-fired with the two different dielectric layers. Calcium silicate, such as CaSiO$_3$ or Ca$_2$SiO$_4$ deposits, thereby reducing the insulation resistance value and dielectric breakdown voltage beyond their practical ranges. If the content of CaO is less than 4 weight %, the reactivity of CaO with the ceramics mainly comprising barium titanate (BaTiO$_3$) is significantly high. This prevents generation of capacitor sections having high electrostatic capacitance.

Therefore, the composition of the above-mentioned insulating layer is restricted within the area surrounded by the lines connecting points A, B$_1$, D, E$_1$, F and G as shown in FIG. 4.

By making adjustment so that the main components, magnesia (MgO), silica (SiO$_2$) and calcia (CaO) of the insulating layers, between which the capacitor section are sandwiched, are within the area surrounded by the lines connecting points A, B$_1$, D, E$_1$, F and G as shown in FIG. 4, the insulating layer can be co-fired with the dielectric layer mainly comprising barium titanate (BaTiO$_3$) and the dielectric ceramics for temperature compensation at 1240° to 1340° C. (the firing temperature range of the dielectric layers). In addition to the crystal phase of forsterite (Mg$_2$SiO$_4$), at least one crystal phase of merwinite (Ca$_3$MgSi$_2$O$_8$), monticellite (CaMgSiO$_4$), akermanite (Ca$_2$MgSi$_2$O$_7$) or enstatite (MgSiO$_3$) is formed in the fired insulating layer. The thermal expansion coefficients of the four crystal phases differ from that of the crystal phase of forsterite. The thermal expansion coefficient of the insulating layer can thus be adjusted. Therefore, thermal stress generation is minimal after the co-firing of the layers.

EXAMPLE 3

The multilayer substrate with inner capacitors of the third invention is detailed below taking an example shown in FIG. 7.

Figure 7:
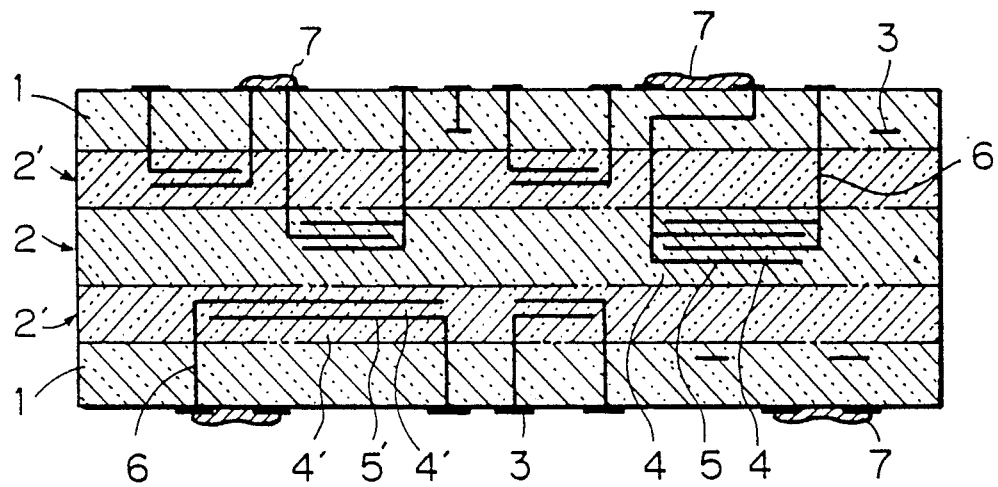
FIG. 7 is a cross section of a circuit substrate common to the third and fourth inventions.

FIG. 7 is a cross section of an example of a multilayer substrate with inner capacitors of the third invention.

Referring to FIG. 7, numeral 1 represents an insulating layer, numerals 2 and 2' represent capacitor sections, numeral 3 represents an electric wiring conductor. The capacitor section 2 is composed of dielectric layer portions 4 mainly comprising barium titanate (BaTiO$_3$) and electrode layers 5 laminated alternately. In the same way, the capacitor section 2' is composed of dielectric layer portions 4' mainly comprising a dielectric ceramics for temperature compensation and electrode layers 5' laminated alternately.

|  | X | Y | Z |
|---|---|---|---|
| A$_1$ | 60 | 36 | 4 |
| B$_1$ | 46 | 50 | 4 |
| D | 30 | 50 | 20 |
| E$_1$ | 30 | 40 | 30 |
| F | 40 | 30 | 30 |
| G | 60 | 30 | 10 |

X, Y and Z respectively represent weight percent values of magnesia (MgO), silica (SiO$_2$) and calcia (CaO).

The insulating layer 1 is made by mixing ceramic material powder comprising MgO and SiO$_2$ an CaO so that its composition is within the area surrounded by the lines connecting points A$_1$, B$_1$, D, E$_1$, F and G as shown in FIG. 4 and by calcining the mixture at 1000° to 1300° C. The calcined substance is pulverized into ceramic powder and mixed with appropriate organic binders, dispersing agents, plasticizers and solvents to process slurry. The slurry is processed into green sheets by a known method such as the doctor blade method. A plurality of the green sheets are laminated to form the insulating layer 1.

The capacitor sections 2 and 2' are made as follows: the dielectric material mainly comprising BaTiO$_3$ and the dielectric material mainly comprising a dielectric ceramics for temperature compensation are respectively mixed and adjusted with organic binders and solvents to form slurry two different types of slurry. Each type of slurry is processed into green sheets by a known method such as the slip cast method. On the obtained dielectric green sheet, silver-palladium (Ag-Pd) alloy paste is printed by the screen printing method according to the predetermined electrode patterns to form the electrode layers 5 and 5'.

To obtain continuity between the top and bottom surfaces of the insulating layer 1 and capacitor sections 2 and 2', through-hole sections 6 are formed by punching the green sheets of the insulating and dielectric layers. In the through-hole sections 6, the above-mentioned alloy paste is filled.

The above-mentioned green sheets of the insulating layer, the dielectric layers mainly comprising barium titanate (BaTiO$_3$) and the dielectric layer comprising dielectric ceramics for temperature compensation respectively are laminated and pressed at heating. The obtained laminations are subjected to a binder burnout process at 200° to 400° C., then co-fired at 1240° to 1340° C. As a result, a multilayer substrate with the capacitor sections 2 and 2' is obtained.

The capacitor sections 2 and 2' are formed by laminating the two different dielectric layers 4' mainly comprising dielectric ceramics for temperature compensation on the top and bottom surfaces of the dielectric layer 4 mainly comprising barium titanate ($BaTiO_3$) with a high dielectric constant. When the layers are co-fired, the lamination can prevent Ti and Ba (with high diffusion speed) from moving in the dielectric layers. This prevents the temperature characteristics of the capacitor sections from being deteriorated.

By printing, Ag-Pd electric wiring conductor patterns are formed on the insulating layer 1 that was co-fired. Resistor patterns comprising ruthenium oxide ($RuO_2$) are also formed on the insulating layer 1 by printing. The obtained substance is then fired at about 850° C. in the air to obtain a multilayer substrate with inner capacitors and resistors 7.

When forming the electric wiring conductor patterns using a material mainly comprising copper (Cu), a resistor material mainly comprising lanthanum boride ($LaB_6$) and stannic ($SnO_2$) is used to form resistor patterns. The resistor patterns are then fired at about 900° C. in an atmosphere of nitrogen. As a result, a multilayer substrate with inner capacitors is obtained in the same way as described above.

The various characteristics of the capacitor sections are not deteriorated if the total amount of unavoidable impurities remaining in the insulating layer 1, alumina ($Al_2O_3$), ferric oxide ($Fe_2O_3$) and barium oxide (BaO), does not exceed 5 weight % of the total (100 weight %) of MgO, $SiO_2$ and CaO.

The third invention is detailed further taking an example of the third invention and a contrast example.

Various types of ceramic material powder comprising MgO and $SiO_2$ and CaO are mixed so that the composition of the insulating layer has the ratios indicated in Table 3 and calcined at 1100° to 1300° C. The calcined substance is pulverized to obtain the desired particle size. Appropriate organic binders and solvents are then added to the obtained material powder to form slurry. The slurry is processed by the doctor blade method to form a green sheet of 200 μm in thickness. The green sheet is then punched to obtain insulating sheets of 170 mm square.

The material powder mainly comprising barium titanate ($BaTiO_3$) and the material powder mainly comprising the dielectric material for temperature compensation indicated in Table 4 are respectively mixed with appropriate binders and solvents to form two different types of slurry. The two types of slurry are processed by the slip cast method to form green sheets of 20 to 60 μm in thickness so that the capacitance values of the two capacitor sections can be set. The sheets are then punched and formed to dielectric sheets of 170 mm square.

On the two different types of the dielectric sheets, Ag-Pd alloy paste is applied by a thick-film printing method such as the screen printing method to form electrode patterns of about 1 to 10 mm square depending on the required electrostatic capacitance.

The through-hole sections formed in the insulating sheets and the two different types of the dielectric sheets are filled with the Ag-Pd alloy paste by the screen printing method.

A plurality of the dielectric sheets comprising dielectric ceramics for temperature compensation are sandwiched between the top and bottom surfaces of the laminated dielectric sheets comprising barium titanate and pressed at heating. The obtained laminations are subjected to a binder burnout process at 200° to 400° C. in the air and fired in the air at the temperatures indicated in Table 3.

The evaluation samples made described above were checked for short-circuit between the electrode layers of the high-capacitance capacitor section and the temperature compensation capacitor sections using an LCR meter. The electrostatic capacitance of the high-capacitance capacitor section was then measured at a frequency of 1 kHz and at an input signal level of 1.0 Vrms using the LCR meter according to the JIS C 5102 standards. Relative permittivity ($\epsilon_r$) was calculated from the electrostatic capacitance. The electrostatic capacitance of the temperature compensation capacitor section was also measured at $-55°$ C. to 125° C. and the change ratios of the electrostatic capacitance values are calculated as temperature coefficients (TCC). In addition, the insulation resistance values of the capacitor sections were measured 60 seconds after 25 V DC was applied to the capacitor sections. The dielectric breakdown voltage values were measured across the terminals of each capacitor section when voltage was applied at a boosting speed of 100 V/second and in an moment the leak current value exceeded 1.0 mA.

The evaluation samples were used for X-ray diffraction of the crystal phase of the insulating layer. The crystal phase was identified according to the X-ray diffraction pattern on the surface of each evaluation sample. The thermal expansion coefficients of the insulating and dielectric layers were obtained by measuring the average thermal expansion coefficients in the temperature range between 40° and 800° C. using square rod test pieces measuring $3 \times 3 \times 40$ mm and having the same compositions as those of the corresponding evaluation samples and fired when the above-mentioned evaluation samples were fired.

Tables 3 and 4 indicate the results of the measurement.

TABLE 3

| | Insulating layer | | | | | | |
|---|---|---|---|---|---|---|---|
| | Composition (weight %) | | | Firing temperature | Thermal expansion coefficient 40~800° C. | | |
| Sample No. | MgO | $SiO_2$ | CaO | (°C.) | (1/°C. × $10^{-6}$) | Crystal phase | Remarks |
| * 1, 2 | 62 | 28 | 10 | 1360 | 12.2 | $Mg_2SiO_4$, MgO | |
| * 3, 4 | 62 | 36 | 2 | 1400 | 12.1 | $Mg_2SiO_4$, MgO | |
| 5, 6 | 60 | 30 | 10 | 1320 | 11.9 | $Mg_2SiO_4$, $CaMgSiO_4$ | FIG. 4,G |
| 7, 8 | 60 | 36 | 4 | 1340 | 11.8 | $Mg_2SiO_4$, $CaMgSiO_4$ | FIG. 4,A |
| 9~15 | 56 | 40 | 4 | 1240 | 11.6 | $Mg_2SiO_4$, $CaMgSiO_4$, $Ca_2MgSi_2O_7$ | |
| 16~22 | 54 | 36 | 10 | 1260 | 11.7 | $Mg_2SiO_4$, $CaMgSiO_4$, $Ca_2MgSi_2O_7$ | |
| * 23, 24 | 52 | 28 | 20 | 1400 | 12.1 | $Mg_2SiO_4$, $CaMgSiO_4$, MgO | |
| 25~31 | 46 | 40 | 14 | 1280 | 11.7 | $Mg_2SiO_4$, $CaMgSiO_4$, $Ca_2MgSi_2O_7$ | |

TABLE 3-continued

| | Insulating layer | | | | | | |
|---|---|---|---|---|---|---|---|
| | Composition (weight %) | | | Firing temperature | Thermal expansion coefficient $40\sim800°$ C. | | |
| Sample No. | MgO | $SiO_2$ | CaO | (°C.) | (1/°C. $\times 10^{-6}$) | Crystal phase | Remarks |
| 32, 33 | 46 | 50 | 4 | 1280 | 11.3 | $Mg_2SiO_4$, $Ca_2MgSi_2O_7$, $MgSiO_3$ | FIG. 4,B1 |
| * 34, 35 | 46 | 52 | 2 | 1300 | 10.8 | $Mg_2SiO_4$, $MgSiO_3$ | |
| 36~42 | 44 | 36 | 20 | 1260 | 11.8 | $Mg_2SiO_4$, $CaMgSiO_4$, $Ca_2MgSi_2O_7$ | |
| * 43, 44 | 40 | 28 | 32 | 1360 | 11.7 | $Mg_2SiO_4$, $CaMgSiO_4$, $Ca_2MgSi_2O_7$, MgO | |
| 45, 46 | 40 | 30 | 30 | 1280 | 11.8 | $Mg_2SiO_4$, $CaMgSiO_4$, $Ca_2MgSi_2O_7$ | FIG. 4,F |
| 47~53 | 40 | 40 | 20 | 1260 | 11.8 | $Mg_2SiO_4$, $CaMgSiO_4$, $Ca_2MgSi_2O_7$ | |
| 54~60 | 40 | 50 | 10 | 1240 | 11.5 | $Mg_2SiO_4$, $CaMgSiO_4$, $MgSiO_3$ | |
| 61, 62 | 35 | 35 | 30 | 1340 | 11.7 | $Mg_2SiO_4$, $Ca_3MgSi_2O_8$, $CaMgSiO_4$ | |
| 63~69 | 35 | 45 | 20 | 1280 | 11.5 | $Mg_2SiO_4$, $CaMgSiO_4$, $Ca_2MgSi_2O_7$ | |
| 70, 71 | 30 | 40 | 30 | 1280 | 11.6 | $Mg_2SiO_4$, $CaMgSiO_4$, $Ca_2MgSi_2O_7$, $Ca_3MgSi_2O_8$ | FIG. 4,E1 |
| 72, 73 | 30 | 50 | 20 | 1240 | 11.4 | $Mg_2SiO_4$, $CaMgSiO_4$ $MgSiO_3$ | FIG. 4,D |
| * 74, 75 | 28 | 40 | 32 | 1280 | 11.7 | $Mg_2SiO_4$, $CaMgSiO_4$ $Ca_2SiO_4$ | |
| * 76, 77 | 28 | 52 | 20 | 1220 | 10.8 | $Mg_2SiO_4$, $Ca_2MgSi_2O_7$, $Ca_2MgSi_2O_6$ | |

Samples identified by the numbers marked * are excluded from the scope of the claims of the third invention.

TABLE 4

| Sample No. | High-capacitance capacitor section | | | | | Temperature-compensation capacitor section | | | | | Remarks |
|---|---|---|---|---|---|---|---|---|---|---|---|
| | Dielectric material (main component) | Thermal expansion coefficient of dielectric layer 40~800° C. (1/°C. × $10^{-6}$) | Relative permittivity $\epsilon r$ | Insulation resistance ($\Omega$) | Dielectric breakdown voltage (V) | Dielectric material (main component) | Thermal expansion coefficient of dielectric layer 40~800° C. (1/°C. × $10^{-6}$) | Temperature coefficient TCC (ppm/°C.) | Insulation resistance ($\Omega$) | Dielectric breakdown voltage (V) | |
| *1 | $BaTiO_3$ | 12.4 | — | — | — | $CaTiO_3$ | 12.0 | — | — | — | Nonmeasurable |
| *2 | " | " | — | — | — | $Mg_2TiO_4$ | 10.5 | — | — | — | Nonmeasurable |
| *3 | " | " | — | — | — | $CaTiO_3$ | 12.0 | — | — | — | Nonmeasurable |
| *4 | " | " | — | — | — | $Mg_2TiO_4$ | 10.5 | — | — | — | Nonmeasurable |
| 5 | " | " | 2500 | >$10^{10}$ | >500 | $CaTiO_3$ | 12.0 | N780 | >$10^{12}$ | >1500 | |
| 6 | " | " | " | " | " | $Mg_2TiO_4$ | 10.5 | N3 | " | " | |
| 7 | " | " | " | " | " | $CaTiO_3$ | 12.0 | N750 | " | " | |
| 8 | " | " | " | " | " | $Mg_2TiO_4$ | 10.5 | N3 | " | " | |
| 9 | " | " | " | " | " | $BaTi_4O_9$ | 11.0 | P2 | " | " | |
| 10 | " | " | " | " | " | $CaTiO_3$ | 12.0 | N750 | " | " | |
| 11 | " | " | " | " | " | $Mg_2TiO_4$ | 10.5 | N4 | " | " | |
| 12 | " | " | " | " | " | $Mg_2TiO_4$ | 11.0 | N720 | " | " | |
| 13 | " | " | " | " | " | $La_2Ti_2O_7$ | 10.6 | N4 | " | " | |
| 14 | " | " | " | " | " | $SrTiO_3$ | 11.6 | N2200 | " | " | |
| 15 | " | " | " | " | " | $Nd_2Ti_2O_7$ | 10.7 | P6 | " | " | |
| 16 | " | " | " | " | " | $BaTi_4O_9$ | 10.5 | P3 | " | " | |
| 17 | " | " | " | " | " | $CaTiO_3$ | 12.0 | N760 | " | " | |
| 18 | " | " | " | " | " | $Mg_2TiO_4$ | 10.5 | N3 | " | " | |
| 19 | " | " | " | " | " | $Mg_2TiO_4$ | 11.0 | N720 | " | " | |
| 20 | " | " | " | " | " | $La_2Ti_2O_7$ | 10.6 | N2 | " | " | |
| 21 | " | " | " | " | " | $SrTiO_3$ | 11.0 | N2300 | " | " | |
| 22 | " | " | " | " | " | $Nd_2Ti_2O_7$ | 10.7 | P3 | " | " | |
| *23 | " | " | — | — | — | $CaTiO_3$ | 12.0 | — | — | — | Nonmeasurable |
| *24 | " | " | — | — | — | $Mg_2TiO_4$ | 10.5 | — | — | — | Nonmeasurable |
| 25 | " | " | 2500 | >$10^{10}$ | >500 | $BaTi_4O_9$ | 10.5 | P8 | >$10^{12}$ | >1500 | |
| 26 | " | " | " | " | " | $CaTiO_3$ | 12.0 | N750 | " | " | |
| 27 | " | " | " | " | " | $Mg_2TiO_4$ | 10.5 | N2 | " | " | |
| 28 | " | " | " | " | " | $Mg_2TiO_4$ | 11.0 | N730 | " | " | |
| 29 | " | " | " | " | " | $La_2Ti_2O_7$ | 10.6 | N4 | " | " | |
| 30 | " | " | " | " | " | $SrTiO_3$ | 11.0 | N2100 | " | " | |
| 31 | " | " | " | " | " | $Nd_2Ti_2O_7$ | 10.7 | P3 | " | " | |
| 32 | " | " | " | " | " | $CaTiO_3$ | 12.0 | N750 | " | " | |
| 33 | " | " | " | " | " | $Mg_2TiO_4$ | 10.5 | N6 | " | " | |
| 34 | " | " | 1950 | $10^7$ | 80 | $CaTiO_3$ | 12.0 | N755 | $10^{10}$ | 1000 | |
| 35 | " | " | 2100 | $10^8$ | 150 | $Mg_2TiO_4$ | 10.5 | N3 | $10^{10}$ | 500 | |
| 36 | " | " | 2500 | >$10^{10}$ | >500 | $BaTi_4O_9$ | 11.0 | P10 | >$10^{12}$ | >1500 | |
| 37 | " | " | " | " | " | $CaTiO_3$ | 12.0 | N750 | " | " | |
| 38 | " | " | " | " | " | $Mg_2TiO_4$ | 10.5 | N5 | " | " | |
| 39 | " | " | " | " | " | $Mg_2TiO_4$ | 11.0 | N710 | " | " | |
| 40 | " | " | " | " | " | $La_2Ti_2O_7$ | 10.6 | N7 | " | " | |
| 41 | " | " | " | " | " | $SrTiO_3$ | 11.0 | N2100 | " | " | |
| 42 | " | " | " | " | " | $Nd_2Ti_2O_7$ | 10.7 | P5 | " | " | |
| *43 | " | " | 1800 | $10^7$ | 300 | $CaTiO_3$ | 12.0 | N900 | $10^{11}$ | 1200 | |
| *44 | " | " | 2100 | $10^8$ | 250 | $Mg_2TiO_4$ | 10.5 | N2 | $10^{10}$ | 1000 | |
| 45 | " | " | 2500 | >$10^{10}$ | >500 | $CaTiO_3O_9$ | 11.0 | N740 | >$10^{12}$ | >1500 | |
| 46 | " | " | " | " | " | $Mg_2TiO_4$ | 10.5 | N1 | " | " | |
| 47 | " | " | " | " | " | $BaTi_4O_9$ | 10.5 | P8 | " | " | |
| 48 | " | " | " | " | " | $CaTiO_3$ | 12.0 | N760 | " | " | |

TABLE 4-continued

| | High-capacitance capacitor section | | | | Temperature-compensation capacitor section | | | | | |
|---|---|---|---|---|---|---|---|---|---|---|
| Sample No. | Dielectric material (main component) | Thermal expansion coefficient of dielectric layer 40~800° C. (1/°C. × 10⁻⁶) | Relative permittivity $\epsilon\Gamma$ | Insulation resistance ($\Omega$) | Dielectric breakdown voltage (V) | Dielectric material (main component) | Thermal expansion coefficient of dielectric layer 40~800° C. (1/°C. × 10⁻⁶) | Temperature coefficient TCC (ppm/°C.) | Insulation resistance ($\Omega$) | Dielectric breakdown voltage (V) | Remarks |
| 49 | " | " | " | " | " | Mg$_2$TiO$_4$ | 10.5 | N3 | " | " | |
| 50 | " | " | " | " | " | Mg$_2$TiO$_4$ | 11.0 | N750 | " | " | |
| 51 | " | " | " | " | " | La$_2$Ti$_2$O$_9$ | 10.6 | P4 | " | " | |
| 52 | " | " | " | " | " | SrTiO$_3$ | 11.0 | N2200 | " | " | |
| 53 | " | " | " | " | " | Nd$_2$Ti$_2$O | 10.7 | P3 | " | " | |
| 54 | " | " | " | " | " | BaTi$_4$O$_9$ | 10.5 | P15 | " | " | |
| 55 | " | " | " | " | " | CaTiO$_3$ | 12.0 | N750 | " | " | |
| 56 | " | " | " | " | " | Mg$_2$TiO$_4$ | 10.5 | N2 | " | " | |
| 57 | " | " | " | " | " | Mg$_2$TiO$_4$ | 11.0 | N720 | " | " | |
| 58 | " | " | " | " | " | La$_2$Ti$_2$O$_9$ | 10.6 | P3 | " | " | |
| 59 | " | " | " | " | " | SrTiO$_3$ | 11.0 | N2100 | " | " | |
| 60 | " | " | " | " | " | Nd$_2$Ti$_2$O | 10.7 | P5 | " | " | |
| 61 | " | " | " | " | " | CaTiO$_3$ | 12.0 | N760 | " | " | |
| 62 | " | " | " | " | " | Mg$_2$TiO$_4$ | 10.5 | N3 | " | " | |
| 63 | " | " | " | " | " | BaTiO$_4$O$_9$ | 10.5 | P10 | " | " | |
| 64 | " | " | " | " | " | CaTiO$_3$ | 12.0 | N746 | " | " | |
| 65 | " | " | " | " | " | Mg$_2$TiO$_4$ | 10.5 | N4 | " | " | |
| 66 | " | " | " | " | " | Mg$_2$TiO$_4$ | 11.0 | N720 | " | " | |
| 67 | " | " | " | " | " | La$_2$Ti$_2$O$_9$ | 10.6 | P2 | " | " | |
| 68 | " | " | " | " | " | SrTiO$_3$ | 11.0 | N2200 | " | " | |
| 69 | " | " | " | " | " | Nd$_2$Ti$_2$O$_7$ | 10.7 | P4 | " | " | |
| 70 | " | " | " | " | " | CaTiO$_3$ | 12.0 | N745 | " | " | |
| 71 | " | " | " | " | " | Mg$_2$TiO$_4$ | 10.5 | N7 | " | " | |
| 72 | " | " | " | 2300 | " | CaTiO$_3$ | 12.0 | N760 | " | " | |
| 73 | " | " | " | " | " | Mg$_2$TiO$_4$ | 10.5 | N10 | " | " | |
| *74 | " | " | 2300 | 10⁹ | 400 | CaTiO$_3$ | 12.5 | N1230 | " | 1200 | |
| *75 | " | " | 2300 | 10⁹ | " | Mg$_2$TiO$_4$ | 10.5 | N50 | 10¹¹ | 1000 | |
| *76 | " | " | 1800 | 10⁸ | 100 | CaTiO$_3$ | 10.2 | N1100 | 10¹⁰ | 800 | |
| *77 | " | " | 1800 | 10⁷ | 150 | Mg$_2$TiO$_4$ | 10.0 | N60 | 10¹¹ | 1000 | |

Samples identified by the numbers marked * are excluded from the scope of the claims of the third invention.

With the multilayer substrate with inner capacitors of the third invention, the insulating layer mainly comprising magnesia, silica and calcia being superior in high-frequency insulation performance can be co-fired with the dielectric layer comprising barium titanate ($BaTiO_3$) with a high dielectric constant and the dielectric layer mainly comprising various dielectric ceramics for temperature compensation without causing reaction between the two different dielectric layers. In addition, the thermal expansion coefficient of the insulating layer can be set very close to those of the dielectric layers. The substrate can thus include both the capacitor section with high electrostatic capacitance and the temperature compensation capacitor section with superior temperature characteristics, both of which are superior in the insulation resistance and dielectric breakdown voltage, without causing cracks in the dielectric layer. As a result, the invention can offer a multilayer substrate with inner capacitors that is miniaturized and high in density, ideally suited for hybrid substrates.

Figure 5:
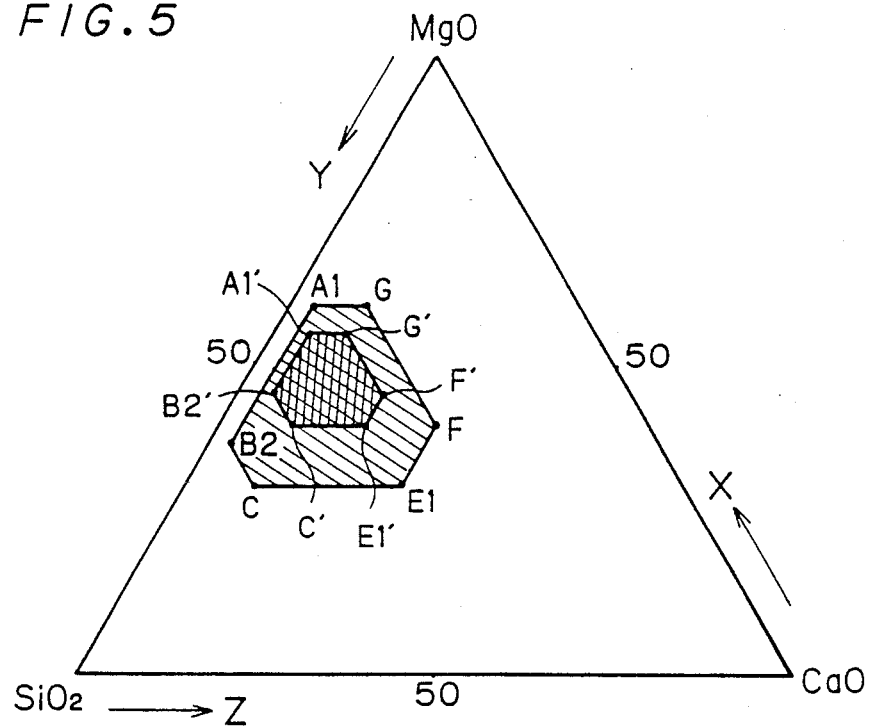
FIG. 5 is a diagram similar to FIG. 2, illustrating the composition area of the insulating layer of the fourth invention.

The insulating layers of the multilayer substrate with inner capacitors of the fourth invention, between which capacitor sections mainly composed of a dielectric ceramics mainly comprising barium titanate ($BaTiO_3$) and dielectric ceramics for temperature compensation are sandwiched, are insulating layers mainly comprising magnesia (MgO), silica ($SiO_2$) and calcia (CaO) within the area surrounded by the lines connecting points $A_1$, $B_2$, C, $E_1$, F and G shown by weight percent in FIG. 5. The content of alumina ($Al_2O_3$) in the insulating layer is between 1 and 15 weight % of the total (100 weight %) of the magnesia (MgO), silica ($SiO_2$) and calcia (CaO). The insulating layer includes at least one crystal phase of forsterite ($Mg_2SiO_4$), merwinite ($Ca_3MgSi_2O_8$), monticellite ($CaMgSiO_4$), akermanite ($Ca_2MgSi_2O_7$), enstatite ($MgSiO_3$) or spinel ($MgAl_2O_4$). The dielectric layers and the insulating layers, between which the capacitor sections being composed of the dielectric layer portions and electrode layers are sandwiched, can be co-fired. Points $A_1$, $B_2$, C, $E_1$, F and G and the lines connecting the points are excluded from the composition area of the insulating layer.

|   | MgO | SiO$_2$ | CaO |
|---|---|---|---|
| A$_1$ | 60 | 36 | 4 |
| B$_2$ | 36 | 60 | 4 |
| C | 30 | 60 | 10 |
| E$_1$ | 30 | 40 | 30 |
| F | 40 | 30 | 30 |
| G | 60 | 30 | 10 |

In the composition of the above-mentioned insulating layer, if the content of MgO is 60 weight % or more, the firing temperature becomes 1300° C. or more and the reactivity between the insulating layer and the two different dielectric materials becomes high. This prevents the insulating layer from being co-fired with the two different dielectric materials, and periclase (MgO) deposits as a crystal phase, thereby reducing resistance against humidity. If the content of MgO is 30 weight % or less, the insulation resistance value and dielectric breakdown voltage reduce beyond their practical ranges.

If the content of $SiO_2$ is 60 weight % or more, the thermal expansion coefficient of the insulating layer reduces. Due to the difference in thermal expansion coefficient between the insulating layer and the dielectric layers, cracks are caused in the dielectric layers and the predetermined dielectric characteristics cannot be obtained. If the content of $SiO_2$ is 30 weight % or less, the firing temperature becomes 1300° C. or more. This prevents the insulating layer from being co-fired with the two different dielectric.

If the content of CaO is 30 weight % or more, the reactivity between the insulating layer and the two different dielectric materials becomes high. This prevents the insulating layer from being co-fired with the two different dielectric materials. Calcium silicate, such as $CaSiO_3$ or $Ca_2SiO_4$ deposits, thereby reducing the insulation resistance value and dielectric breakdown voltage beyond their practical ranges. If the content of CaO is 4 weight % or less, the thermal expansion coefficient of the insulating layer reduces and the dielectric layers are cracked due to the same reason as described above, preventing the predetermined dielectric characteristics from being obtained.

If the content of $Al_2O_3$ exceeds 15 weight %, thermal expansion coefficient of the insulating layer reduces. If the content of $Al_2O_3$ is less than 1 weight %, the firing temperature becomes 1300° C. or more, causing the problem similar to that described above.

Therefore, the composition of the above-mentioned insulating layer is restricted within the area described above. The more favorable area is that surrounded by the lines connecting points $A_1'$, $B_2'$, C', $E_1'$, $F_1'$ and G' as shown in FIG. 5. In addition, the content of alumina ($Al_2O_3$) in the insulating layer is restricted in the range between 2 and 15 weight % of the total (100 weight %) of the magnesia (MgO), silica ($SiO_2$) and calcia (CaO).

|   | MgO | SiO$_2$ | CaO |
|---|---|---|---|
| A$_1'$ | 55 | 40 | 5 |
| B$_2'$ | 45 | 50 | 5 |
| C' | 40 | 50 | 10 |
| E$_1'$ | 40 | 40 | 20 |
| F$_1'$ | 45 | 35 | 20 |
| G' | 55 | 35 | 10 |

By making adjustment so that the main components, magnesia (MgO), silica ($SiO_2$), calcia (CaO) and alumina ($Al_2O_3$) of the insulating layers, between which the capacitor sections are sandwiched, are within the above-mentioned area, the insulating material can be co-fired with the dielectric material mainly comprising barium titanate ($BaTiO_3$) and the dielectric ceramics for temperature compensation at 1220° to 1280° C. (the firing temperature range of the dielectric materials). In addition to the crystal phase of forsterite ($Mg_2SiO_4$), at least one crystal phase of merwinite ($Ca_3MgSi_2O_8$), monticellite ($CaMgSiO_4$), akermanite ($Ca_2MgSi_2O_7$), enstatite ($MgSiO_3$) or spinel ($MgAl_2O_4$) is formed in the fired insulating layer. The thermal expansion coefficients of the five crystal phases differ from that of the crystal phase of forsterite. The thermal expansion coefficient of the insulating layer can thus be adjusted. Therefore, thermal stress generation is minimal after the co-firing of the layers.

By adding alumina ($Al_2O_3$) as a main component of the insulating layer, the firing temperature of the insulating layer can be reduced. Reaction with the dielectric materials due to diffusion can thus be prevented.

EXAMPLE 4

The multilayer substrate with inner capacitors of the fourth invention is detailed below taking an example shown in FIG. 7.

FIG. 7 is a cross section of an example of a multilayer substrate with inner capacitors of the fourth invention. Since the structure of the multilayer substrate is the same as that of the third invention, the explanation of the structure is omitted.

|     | MgO | SiO$_2$ | CaO |
| --- | --- | --- | --- |
| A$_1$ | 60 | 36 | 4 |
| B$_2$ | 36 | 60 | 4 |
| C | 30 | 60 | 10 |
| E$_1$ | 30 | 40 | 30 |
| F | 40 | 30 | 30 |
| G | 60 | 30 | 10 |

Points A$_1$, B$_2$, C, E$_1$, F and G and the lines connecting the points are excluded from the composition area.

The insulating layer 1 is made by mixing ceramic material powder comprising MgO and SiO$_2$ and CaO so that its composition is within the area surrounded by the lines connecting points A$_1$, B$_2$, C, E$_1$, F and G as shown in FIG. 5 and so that the content of alumina in the insulating layer is restricted in the range between 1 and 15 weight % of the total (100 weight %) of MgO, SiO$_2$ and CaO, and by calcining the mixture at 1000° to 1300° C. The calcined substance is pulverized into ceramic powder and mixed with appropriate organic binders, dispersing agents, plasticizers and solvents to form slurry. The slurry is processed into green sheets by a known method such as the doctor blade method. A plurality of the green sheets are laminated to form the insulating layer 1.

The capacitor sections 2 and 2' are made as follows: the dielectric material powder mainly comprising BaTiO$_3$ and the dielectric material mainly comprising dielectric ceramics for temperature compensation are respectively mixed and adjusted with organic binders and solvents to form two different types of slurry. Each type of slurry is processed into green sheets by a known method such as the slip cast method. On the obtained dielectric green sheets, silver-palladium (Ag-Pd) alloy paste is printed by the screen printing method according to the predetermined electrode patterns to form the electrode layers 5 and 5'.

To obtain continuity between the top and bottom surfaces of the insulating layer 1 and capacitor sections 2 and 2', through-hole sections 6 are formed by punching the green sheets of the insulating and dielectric layers. In the through-hole sections 6, the above-mentioned alloy paste is filled.

The above-mentioned green sheets of the insulating layer, the dielectric layers mainly comprising barium titanate (BaTiO$_3$) and the dielectric layer comprising dielectric ceramics for temperature compensation respectively are laminated and pressed at heating. The obtained laminations are subjected to a binder burnout process at 200° to 400° C., then co-fired at 1220° to 1280° C. As a result, a multilayer substrate with inner capacitor sections 2 and 2' is obtained.

The capacitor sections 2 and 2' are formed by laminating the two different dielectric layers 4' mainly comprising dielectric ceramics for temperature compensation on the top and bottom surfaces of the dielectric layer 4 mainly comprising barium titanate (BaTiO$_3$) with a high dielectric constant. When the layers are co-fired, the lamination can prevent Ti and Ba (with high diffusion speed) from moving in the dielectric layers. This prevents the temperature characteristics of the capacitor sections from being deteriorated.

Ag-Pd electric wiring conductor patterns are formed on the fired insulating layer 1 by printing. Resistor patterns comprising ruthenium oxide (RuO$_2$) are also formed on the insulation layer 1 by printing. The obtained substance is then fired at about 850° C. in the air to obtain a multilayer substrate with inner capacitors and the resistors 7.

When forming the electric wiring conductor patterns using a material mainly comprising copper (Cu), a resistor material mainly comprising lanthanum boride (LaB$_6$) and stannic oxide (SnO$_2$) is used to form resistor patterns. The resistor patterns are then fired at about 900° C. in an atmosphere of nitrogen. As a result, a multilayer substrate with inner capacitors is obtained in the same way as described above.

The various characteristics of the capacitor sections are not deteriorated if the total amount of unavoidable impurities remaining in the insulating layer 1, ferric oxide (Fe$_2$O$_3$) and barium oxide (BaO), does not exceed 5 weight % of the total (100 weight %) of MgO, SiO$_2$, CaO and Al$_2$O$_3$.

The fourth invention is detailed further taking an example of the fourth invention.

Different types of ceramic material powder comprising MgO and SiO$_2$, CaO and Al$_2$O$_3$ are mixed so that the composition of the insulating layer has the ratios indicated in Table 5 and calcined at 1100° to 1250° C. The calcined substance is pulverized to obtain the desired particle size. Appropriate organic binders and solvents are then added to the obtained material powder to form slurry. The slurry is processed by the doctor blade method to form a green sheet of 200 μm in thickness. The green sheet is then punched to obtain insulating sheets of 170 mm square.

The material powder mainly comprising barium titanate (BaTiO$_3$) and the material powder mainly comprising the dielectric material for temperature compensation indicated in Table 6 are respectively mixed with appropriate binders and solvents to form two different types of slurry. The two types of slurry are processed by the slip cast method to form green sheets of 20 to 60 μm in thickness so that the capacitance values of the two capacitor sections can be set. The sheets are then punched and formed to dielectric sheets of 170 mm square.

On the two different types of the dielectric sheets, Ag-Pd alloy paste is applied by a thick-film printing method such as the screen printing method to form electrode patterns of about 1 to 10 mm square depending on the required electrostatic capacitance.

The through-hole sections formed in the insulating sheets and the two different types of the dielectric sheets are filled with the Ag-Pd alloy paste by the screen printing method.

A plurality of the dielectric sheets comprising dielectric ceramics for temperature compensation are sandwiched between the top and bottom surfaces of the laminated dielectric sheets comprising barium titanate and pressed at heating. The obtained laminations are subjected to a binder burnout process at 200° to 400° C. in the air and fired in the air at the temperatures indicated in Table 6.

The evaluation samples made described above were checked for short-circuit between the electrode layers of the high-capacitance capacitor section and the temperature compensation capacitor sections using an LCR meter. The electrostatic capacitance of the high-capacitance capacitor section was then measured at a frequency of 1 kHz and at an input signal level of 1.0 Vrms using the LCR meter according to the JIS C 5102 standards. Relative permittivity ($\epsilon_r$) was calculated from the electrostatic capacitance. The electrostatic capacitance of the temperature compensation capacitor section was also measured at $-55°$ C. to 125° C. and the change ratios of the electrostatic capacitance values are calculated as temperature coefficients (TCC). In addition, the insulation resistance values of the capacitor sections were measured 60 seconds after 25 V DC was applied to the capacitor sections. The dielectric breakdown voltage values were measured across the terminals of each capacitor section when voltage was applied at a boosting speed of 100 V/second and in an moment the leak current value exceeded 1.0 mA.

The evaluation samples were used for X-ray diffraction of the crystal phase of the insulating layer. The crystal phase was identified according to the X-ray diffraction pattern on the surface of each evaluation sample. The thermal expansion coefficients of the insulating and dielectric layers were obtained by measuring the average thermal expansion coefficients in the temperature range between 40° and 800° C. using square rod test pieces measuring $3 \times 3 \times 40$ mm and having the same compositions as those of the corresponding evaluation samples and co-fired with the evaluation samples.

In addition, the green sheets having the same compositions as those of the above-mentioned evaluation samples of the insulating layer are pressed and laminated, then fired when the above-mentioned evaluation samples were fired. The fired substance was formed into flat test pieces of 10 mm in width, 50 mm in length and 1.2 mm in thickness. Each test piece was subjected to a three-point bending test by applying a load to the center of the two support points (having a distance of 30 mm) of the test piece at a speed of 0.5 mm per minute to measure the flexural strength of the insulating layer.

Tables 5 and 6 indicate the results of the measurement.

TABLE 5

| Sample No. | Composition (weight %) MgO | $SiO_2$ | CaO | $Al_2O_3$ | Firing temperature (°C.) | Crystal phase | Thermal expansion coefficient 40~800° C. (1/°C. × $10^{-6}$) | Flexural strength (kg/mm²) |
|---|---|---|---|---|---|---|---|---|
| *1 | 60 | 33 | 7 | 2 | 1320 | $Mg_2SiO_4$, $Ca_2MgSi_2O_7$, MgO | 12.2 | — |
| 2, 3 | 59 | 34 | 7 | 5 | 1250 | $Mg_2SiO_4$, $Ca_2MgSi_2O_7$, $MgAl_2O_4$ | 11.8 | 20.5 |
| 4, 5 | 59 | 32 | 9 | 2 | 1280 | $Mg_2SiO_4$, $CaMgSiO_4$, $Ca_2MgSi_2O_7$ | 11.9 | 17.8 |
| *6 | 59 | 30 | 11 | 2 | 1340 | $Mg_2SiO_4$, $Ca_2MgSi_2O_7$, $MgAl_2O_4$, MgO | 11.9 | 19.8 |
| *7 | 55 | 41 | 4 | 3 | 1280 | $Mg_2SiO_4$, $Ca_2MgSi_2O_7$, $MgAl_2O_4$ | 10.8 | 17.5 |
| 8 | 54 | 41 | 5 | 2 | 1280 | $Mg_2SiO_4$, $CaMgSiO_4$, $Ca_2MgSi_2O_7$, $MgAl_2O_4$ | 11.9 | 19.2 |
| 9, 10 | 56 | 39 | 5 | 5 | 1260 | $Mg_2SiO_4$, $CaMgSiO_4$, $Ca_2MgSi_2O_7$, $MgAl_2O_4$ | 11.7 | 21.5 |
| 11, 12 | 56 | 34 | 10 | 5 | 1260 | $Mg_2SiO_4$, $CaMgSiO_4$, $Ca_2MgSi_2O_7$, $MgAl_2O_4$ | 11.9 | 20.0 |
| 13, 14 | 51 | 44 | 5 | 2 | 1280 | $Mg_2SiO_4$, $CaMgSiO_4$, $MgAl_2O_4$ | 11.4 | 18.8 |
| *15 | 53 | 43 | 4 | 6 | 1240 | $Mg_2SiO_4$, $Ca_2MgSi_2O_7$, $MgAl_2O_4$ | 10.2 | 20.5 |
| 16~22 | 53 | 42 | 5 | 5 | 1250 | $Mg_2SiO_4$, $Ca_2MgSi_2O_7$, $MgAl_2O_4$ | 11.7 | 20.0 |
| 23, 24 | 57 | 37 | 6 | 14 | 1220 | $Mg_2SiO_4$, $Ca_2MgSi_2O_7$, $MgAl_2O_4$ | 11.4 | 22.5 |
| 25, 26 | 55 | 35 | 10 | 10 | 1230 | $Mg_2SiO_4$, $Ca_2MgSi_2O_7$, $MgAl_2O_4$ | 11.6 | 21.0 |
| 27~33 | 52 | 34 | 14 | 5 | 1250 | $Mg_2SiO_4$, $CaMgSiO_4$, $Ca_2MgSi_2O_7$, $MgAl_2O_4$ | 12.0 | 19.9 |
| 34, 35 | 46 | 49 | 5 | 2 | 1280 | $Mg_2SiO_4$, $MgSiO_3$, $Ca_2MgSi_2O_7$ | 11.3 | 18.5 |
| *36 | 46 | 45 | 9 | 1 | 1310 | $Mg_2SiO_4$, $CaMgSiO_4$, $Ca_2MgSi_2O_7$ | 12.0 | 17.0 |
| 37~43 | 48 | 47 | 5 | 5 | 1250 | $Mg_2SiO_4$, $MgSiO_3$, $Ca_2MgSi_2O_7$, $MgAl_2O_4$ | 11.6 | 19.8 |
| 44~50 | 47 | 42 | 11 | 5 | 1250 | $Mg_2SiO_4$, $Ca_2MgSi_2O_7$, $MgAl_2O_4$ | 11.7 | 19.6 |
| 51~57 | 47 | 37 | 16 | 4 | 1250 | $Mg_2SiO_4$, $CaMgSiO_4$, $Ca_2MgSi_2O_7$, $MgAl_2O_4$ | 11.8 | 19.4 |
| 58, 59 | 46 | 33 | 21 | 3 | 1260 | $Mg_2SiO_4$, $CaMgSiO_4$, $Ca_2MgSi_2O_7$, $MgAl_2O_4$ | 11.8 | 19.0 |
| 60, 61 | 44 | 51 | 5 | 5 | 1260 | $Mg_2SiO_4$, $MgSiO_3$, $Ca_2MgSi_2O_7$, $MgAl_2O_4$ | 11.4 | 20.5 |
| 62, 63 | 43 | 47 | 10 | 3 | 1250 | $Mg_2SiO_4$, $MgSiO_3$, $Ca_2MgSi_2O_7$, $MgAl_2O_4$ | 11.6 | 20.3 |
| 64, 65 | 43 | 41 | 16 | 3 | 1250 | $Mg_2SiO_4$, $Ca_2MgSi_2O_7$, $MgAl_2O_4$ | 11.7 | 20.0 |
| 66, 67 | 43 | 38 | 19 | 2 | 1280 | $Mg_2SiO_4$, $CaMgSiO_4$, $Ca_2MgSi_2O_7$ | 11.8 | 18.8 |
| *68 | 49 | 44 | 7 | 15 | 1230 | $Mg_2SiO_4$, $MgAl_2O_4$ | 10.2 | 24.5 |
| 69, 70 | 43 | 33 | 24 | 3 | 1230 | $Mg_2SiO_4$, $CaMgSiO_4$, $Ca_2MgSi_2O_7$, $MgAl_2O_4$ | 11.8 | 20.1 |
| 71, 72 | 38 | 57 | 5 | 5 | 1240 | $Mg_2SiO_4$, $MgSiO_3$, $Ca_2MgSi_2O_7$, $MgAl_2O_4$ | 11.3 | 21.2 |
| 73, 74 | 40 | 49 | 11 | 10 | 1230 | $Mg_2SiO_4$, $MgSiO_3$, $Ca_2MgSi_2O_7$, $MgAl_2O_4$ | 11.5 | 21.5 |
| 75, 76 | 40 | 38 | 22 | 10 | 1230 | $Mg_2SiO_4$, $CaMgSiO_4$, $Ca_2MgSi_2O_7$, $MgAl_2O_4$ | 11.6 | 21.3 |
| 77~83 | 38 | 33 | 29 | 4 | 1230 | $Mg_2SiO_4$, $CaMgSiO_4$, $Ca_2MgSi_2O_7$ | 11.9 | 20.7 |
| *84 | 35 | 60 | 5 | 3 | 1250 | $Mg_2SiO_4$, $MgSiO_3$, $Ca_2MgSi_2O_7$, $MgAl_2O_4$ | 11.2 | 19.5 |
| 85, 86 | 35 | 59 | 6 | 5 | 1230 | $Mg_2SiO_4$, $MgSiO_3$, $Ca_2MgSi_2O_7$, $MgAl_2O_4$ | 11.1 | 20.5 |
| 87, 88 | 34 | 42 | 24 | 5 | 1230 | $Mg_2SiO_4$, $CaMgSiO_4$, $Ca_2MgSi_2O_7$, $MgAl_2O_4$ | 11.7 | 19.8 |
| 89~95 | 36 | 35 | 29 | 9 | 1220 | $Mg_2SiO_4$, $CaMgSiO_4$, $Ca_2MgSi_2O_7$, $CaMgSi_2O_8$ | 11.8 | 21.3 |
| *96 | 35 | 35 | 30 | 6 | 1240 | $Mg_2SiO_4$, $CaMgSi_2O_8$, $Ca_2SiO_4$ | 12.0 | 15.8 |
| *97 | 30 | 53 | 17 | 5 | 1230 | $Mg_2SiO_4$, $MgSiO_3$, $Ca_2MgSi_2O_7$, $MgAl_2O_4$ | 11.5 | 20.2 |

Samples identified by the numbers marked * are excluded from the scope of the claims of the fourth invention.

TABLE 6

| | High-capacitance capacitor section | | | | | Temperature - compensation capacitor section | | | | | |
|---|---|---|---|---|---|---|---|---|---|---|---|
| Sample No. | Dielectric material (main component) | Thermal expansion coefficient of dielectric layer 40~800° C. (1/°C. × 10⁻⁶) | Relative permittivity εΓ | Insulation resistance (Ω) | Dielectric breakdown voltage (V) | Dielectric material (main component) | Thermal expansion coefficient of dielectric layer 40~800° C. (1/°C. × 10⁻⁶) | Temperature coefficient TCC (ppm/°C.) | Insulation resistance (Ω) | Dielectric breakdown voltage (V) | Remarks |
| *1 | BaTiO₃ | 12.4 | — | — | — | Mg₂TiO₄ | 10.5 | — | — | — | Nonmeasurable |
| 2 | " | " | 2500 | >10¹⁰ | >500 | CaTiO₃ | 12.0 | N750 | >10¹² | >1500 | |
| 3 | " | " | " | " | " | Mg₂TiO₄ | 10.5 | N3 | " | " | |
| 4 | " | " | " | " | " | CaTiO₃ | 12.0 | N780 | " | " | |
| *5 | " | " | " | " | " | Mg₂TiO₄ | 10.5 | N3 | " | " | |
| *6 | " | " | — | — | — | CaTiO₃ | 12.0 | — | — | — | Nonmeasurable |
| 7 | " | " | — | — | — | CaTiO₃ | 12.0 | N750 | >10¹² | >1500 | Partially nonmeasurable |
| 8 | " | " | 2500 | >10¹⁰ | >500 | Mg₂TiO₄ | 10.5 | N3 | " | " | |
| 9 | " | " | " | " | " | CaTiO₃ | 12.0 | N750 | " | " | |
| 10 | " | " | " | " | " | Mg₂TiO₄ | 11.0 | N720 | " | " | |
| 11 | " | " | " | " | " | CaTiO₃ | 12.0 | N750 | " | " | |
| 12 | " | " | " | " | " | Mg₂TiO₄ | 10.5 | N3 | " | " | |
| 13 | " | " | " | " | " | CaTiO₃ | 12.0 | N750 | " | " | |
| 14 | " | " | " | " | " | Mg₂TiO₄ | 10.5 | N3 | " | " | |
| *15 | " | " | 1500 | 10⁷ | 50 | CaTiO₃ | 12.0 | N900 | 10⁹ | 1050 | |
| 16 | " | " | 2500 | >10¹⁰ | >500 | BaTi₄O₇ | 10.5 | P2 | >10¹² | >1500 | |
| 17 | " | " | " | " | " | CaTiO₃ | 12.0 | N750 | " | " | |
| 18 | " | " | " | " | " | Mg₂TiO₄ | 10.5 | N4 | " | " | |
| 19 | " | " | " | " | " | Mg₂TiO₄ | 11.0 | N720 | " | " | |
| 20 | " | " | " | " | " | La₂Ti₂O₇ | 10.6 | N4 | " | " | |
| 21 | " | " | " | " | " | SrTiO₃ | 11.6 | N2200 | " | " | |
| 22 | " | " | " | " | " | Nd₂Ti₂O₇ | 10.7 | P6 | " | " | |
| 23 | BaTiO₃ | 12.4 | 2500 | >10¹⁰ | >500 | CaTiO₃ | 12.0 | N750 | >10¹² | >1500 | |
| 24 | " | " | " | " | " | Mg₂TiO₄ | 10.5 | N3 | " | " | |
| 25 | " | " | " | " | " | CaTiO₃ | 12.0 | N750 | " | " | |
| 26 | " | " | " | " | " | Mg₂TiO₄ | 10.5 | N2 | " | " | |
| 27 | " | " | " | " | " | BaTi₄O₇ | 10.5 | P3 | " | " | |
| 28 | " | " | " | " | " | CaTiO₃ | 12.0 | N750 | " | " | |
| 29 | " | " | " | " | " | Mg₂TiO₄ | 10.5 | N5 | " | " | |
| 30 | " | " | " | " | " | Mg₂TiO₄ | 11.0 | N710 | " | " | |
| 31 | " | " | " | " | " | La₂Ti₂O₇ | 10.6 | N5 | " | " | |
| 32 | " | " | " | " | " | SrTiO₃ | 11.6 | N2100 | " | " | |
| 33 | " | " | " | " | " | Nd₂Ti₂O₇ | 10.7 | P6 | " | " | |
| 34 | " | " | " | " | " | CaTiO₃ | 12.0 | N750 | " | " | |
| 35 | " | " | " | " | " | Mg₂TiO₄ | 11.0 | N710 | " | " | |
| *36 | " | " | — | — | — | CaTiO₃ | 12.0 | — | — | — | Nonmeasurable |
| 37 | " | " | 2500 | >10¹⁰ | >500 | BaTi₄O₇ | 10.5 | P3 | >10¹² | >1500 | |
| 38 | " | " | " | " | " | CaTiO₃ | 12.0 | N750 | " | " | |
| 39 | " | " | " | " | " | Mg₂TiO₄ | 10.5 | N5 | " | " | |
| 40 | " | " | " | " | " | Mg₂TiO₄ | 11.0 | N710 | " | " | |
| 41 | " | " | " | " | " | La₂Ti₂O₇ | 10.6 | N5 | " | " | |
| 42 | " | " | " | " | " | SrTiO₃ | 11.6 | N2200 | " | " | |
| 43 | " | " | " | " | " | Nd₂Ti₂O₇ | 10.7 | P5 | " | " | |
| 44 | " | " | " | " | " | BaTi₄O₇ | 10.5 | P3 | " | " | |
| 45 | " | " | " | " | " | CaTiO₃ | 12.0 | N750 | " | " | |
| 46 | " | " | " | " | " | Mg₂TiO₄ | 10.5 | N5 | " | " | |
| 47 | " | " | " | " | " | Mg₂TiO₄ | 11.0 | N720 | " | " | |
| 48 | BaTiO₃ | 12.4 | 2500 | >10¹⁰ | >500 | La₂Ti₂O₇ | 10.6 | N5 | >10¹² | >1500 | |
| 49 | " | " | " | " | " | SrTiO₃ | 11.6 | N2100 | " | " | |
| 50 | " | " | " | " | " | Nd₂Ti₂O₇ | 10.7 | P6 | " | " | |
| 51 | " | " | " | " | " | BaTi₄O₇ | 10.5 | P4 | " | " | |
| 52 | " | " | " | " | " | CaTiO₃ | 12.0 | N760 | " | " | |
| 53 | " | " | " | " | " | Mg₂TiO₄ | 10.5 | N6 | " | " | |
| 54 | " | " | " | " | " | Mg₂TiO₄ | 11.0 | N720 | " | " | |
| 55 | " | " | " | " | " | La₂Ti₂O₇ | 10.6 | N6 | " | " | |
| 56 | " | " | " | " | " | SrTiO₃ | 11.6 | N2200 | " | " | |
| 57 | " | " | " | " | " | Nd₂Ti₂O₇ | 10.7 | P6 | " | " | |
| 58 | " | " | " | " | " | CaTiO₃ | 12.0 | N760 | " | " | |
| 59 | " | " | " | " | " | Mg₂TiO₄ | 11.0 | N710 | " | " | |
| 60 | " | " | " | " | " | CaTiO₃ | 12.0 | N750 | " | " | |
| 61 | " | " | " | " | " | Mg₂TiO₄ | 10.5 | N5 | " | " | |
| 62 | " | " | " | " | " | CaTiO₃ | 12.0 | N750 | " | " | |
| 63 | " | " | " | " | " | Mg₂TiO₄ | 11.0 | N720 | " | " | |
| 64 | " | " | " | " | " | CaTiO₃ | 12.0 | N750 | " | " | |
| 65 | " | " | " | " | " | Mg₂TiO₄ | 10.5 | N3 | " | " | |
| 66 | " | " | " | " | " | CaTiO₃ | 12.0 | N750 | " | " | |
| 67 | " | " | " | " | " | Mg₂TiO₄ | 11.0 | N720 | " | " | |
| *68 | " | " | 2050 | 10⁷ | 50 | Mg₂TiO₄ | 10.5 | — | 10⁹ | 800 | Partially nonmeasurable |

TABLE 6-continued

| | High-capacitance capacitor section | | | | Temperature - compensation capacitor section | | | | | |
|---|---|---|---|---|---|---|---|---|---|---|
| Sample No. | Dielectric material (main component) | Thermal expansion coefficient of dielectric layer 40~800° C. (1/°C. × 10$^{-6}$) | Relative permittivity $\epsilon\Gamma$ | Insulation resistance ($\Omega$) | Dielectric breakdown voltage (V) | Dielectric material (main component) | Thermal expansion coefficient of dielectric layer 40~800° C. (1/°C. × 10$^{-6}$) | Temperature coefficient TCC (ppm/°C.) | Insulation resistance ($\Omega$) | Dielectric breakdown voltage (V) | Remarks |
| 69 | " | " | 2500 | >10$^{10}$ | >500 | CaTiO$_3$ | 12.0 | N750 | >10$^{12}$ | >1500 | |
| 70 | " | " | " | " | " | Mg$_2$TiO$_4$ | 11.0 | N720 | " | " | |
| 71 | " | " | " | " | " | CaTiO$_3$ | 12.0 | N750 | " | " | |
| 72 | " | " | " | " | " | Mg$_2$TiO$_4$ | 10.5 | N4 | " | " | |
| 73 | BaTiO$_3$ | 12.4 | 2500 | >10$^{10}$ | >500 | CaTiO$_3$ | 12.0 | N750 | >10$^{12}$ | >1500 | |
| 74 | " | " | " | " | " | Mg$_2$TiO$_4$ | 11.0 | N720 | " | " | |
| 75 | " | " | " | " | " | CaTiO$_3$ | 12.0 | N750 | " | " | |
| 76 | " | " | " | " | " | Mg$_2$TiO$_4$ | 11.0 | N720 | " | " | |
| 77 | " | " | " | " | " | BaTi$_4$O$_7$ | 10.5 | P3 | " | " | |
| 78 | " | " | " | " | " | CaTiO$_3$ | 12.0 | N750 | " | " | |
| 79 | " | " | " | " | " | Mg$_2$TiO$_4$ | 10.5 | N4 | " | " | |
| 80 | " | " | " | " | " | Mg$_2$TiO$_4$ | 11.0 | N720 | " | " | |
| 81 | " | " | " | " | " | La$_2$Ti$_2$O$_7$ | 10.6 | N4 | " | " | |
| 82 | " | " | " | " | " | SrTiO$_3$ | 11.6 | N2200 | " | " | |
| 83 | " | " | " | " | " | Nd$_2$Ti$_2$O$_7$ | 10.7 | P5 | " | " | |
| *84 | " | " | 1980 | 10$^7$ | 50 | CaTiO$_3$ | 12.0 | N900 | 10$^9$ | 900 | |
| 85 | " | " | 2500 | >10$^{10}$ | >500 | CaTiO$_3$ | 12.0 | N750 | >10$^{12}$ | >1500 | |
| 86 | " | " | " | " | " | Mg$_2$TiO$_4$ | 10.5 | N5 | " | " | |
| 87 | " | " | " | " | " | CaTiO$_3$ | 12.0 | N760 | " | " | |
| 88 | " | " | " | " | " | Mg$_2$TiO$_4$ | 11.0 | N720 | " | " | |
| 89 | " | " | " | " | " | BaTi$_4$O$_7$ | 10.5 | P4 | " | " | |
| 90 | " | " | " | " | " | CaTiO$_3$ | 12.0 | N750 | " | " | |
| 91 | " | " | " | " | " | Mg$_2$TiO$_4$ | 10.5 | N5 | " | " | |
| 92 | " | " | " | " | " | Mg$_2$TiO$_4$ | 11.0 | N710 | " | " | |
| 93 | " | " | " | " | " | La$_2$Ti$_2$O$_7$ | 10.6 | N5 | " | " | |
| 94 | " | " | " | " | " | SrTiO$_3$ | 11.6 | N2100 | " | " | |
| 95 | " | " | " | " | " | Nd$_2$Ti$_2$O$_7$ | 10.7 | P6 | " | " | |
| *96 | " | " | 2150 | 10$^8$ | 150 | CaTiO$_3$ | 12.0 | N900 | 10$^{10}$ | 1000 | |
| *97 | " | " | 2200 | 10$^9$ | 350 | CaTiO$_3$ | 12.0 | N900 | 10$^{10}$ | 1000 | |

Samples identified by the numbers marked * are excluded from the scope of the claims of the fourth invention.

With the multilayer substrate with inner capacitors of the fourth invention, the insulating layer mainly comprising magnesia, silica, calcia and alumina being superior in high-frequency insulation performance can be co-fired at a low temperature with the dielectric layer comprising barium titanate (BaTiO$_3$) with a high dielectric constant and the dielectric layer mainly comprising various dielectric ceramics for temperature compensation without causing reaction between the two different dielectric layers. In addition, the thermal expansion coefficient of the insulating layer can be set very close to those of the dielectric layers. The substrate can thus include both the capacitor section with high electrostatic capacitance and the temperature compensation capacitor section with superior temperature characteristics, both of which are superior in the insulation resistance and dielectric breakdown voltage without causing cracks in the dielectric layer. Furthermore, the insulating layer can be strengthened and the electric wiring conductor layers can be firmly coated on the insulating layer. As a result, the invention can offer a multilayer substrate with inner capacitors that is miniaturized and high in density, ideally suited for hybrid substrates.

It can be easily understood that the compositions of the dielectric and insulating layers and the objects, functions and effects of the genus invention are based on the unification of the first to fourth inventions detailed above. Therefore, without explaining the genus invention that is defined by claim 1 and FIGS. 1 and 6, the details of the genus invention will be obvious from the explanations of the first to fourth inventions.

We claim:

1. A multilayer substrate with inner capacitors comprising a dielectric layer sandwiched between upper and lower insulating layers, a couple of printed electrodes in desired patterns within the thickness of the dielectric layer so as to form each capacitor at the portion of said dielectric layer corresponding to said electrodes, and a couple of leading terminals on one surface of said insulating layer, which communicate with said electrodes, said multilayer substrate being characterized in that said dielectric layer is composed of a ceramic composition mainly comprising MTiO$_3$-based ceramics (M represents one or several of Ba, Ca, Mg, La, Sr and Nd) and that said insulating layer is composed of a ceramic composition mainly comprising MgO-SiO$_2$-CaO-based ceramics, which is defined by an area surrounded by the lines connecting points A, B, C, D, E, F and G as shown in FIG. 1 and listed below, wherein X, Y and Z respectively represent weight percent values of MgO, SiO$_2$ and CaO at points A, B, C, D, E, F and G:

| | X | Y | Z |
|---|---|---|---|
| A | 60 | 40 | 0 |
| B | 40 | 60 | 0 |
| C | 30 | 60 | 10 |
| D | 30 | 50 | 20 |
| E | 20 | 50 | 30 |
| F | 40 | 30 | 30 |
| G | 60 | 30 | 10 |

2. A multilayer substrate with inner capacitors according to claim 1, wherein said dielectric layer is composed of a ceramic composition mainly comprising BaTiO$_3$ and said insulating layer is mainly composed of a ceramic composition mainly comprising MgO-SiO$_2$-CaO-based ceramics, which is defined by an area surrounded by the lines connecting points $A_1$, $B_1$, E, F and G as shown in FIG. 2 and listed below:

|   | X | Y | Z |
|---|----|----|----|
| $A_1$ | 60 | 36 | 4 |
| $B_1$ | 46 | 50 | 4 |
| E | 20 | 50 | 30 |
| F | 40 | 30 | 30 |
| G | 60 | 30 | 10 |

3. A multilayer substrate with inner capacitors according to claim 2, wherein said insulating layer includes at least one crystal phase of forsterite ($Mg_2SiO_4$), monticellite ($CaMgSiO_4$) or akermanite ($Ca_2MgSi_2O_7$).

4. A multilayer substrate with inner capacitors according to claim 2, wherein said dielectric layer and said insulating layers, between which said capacitor section being composed of said dielectric layer portions and electrode layers are sandwiched, can be co-fired.

5. A multilayer substrate with inner capacitors according to claim 1, wherein said dielectric layer is composed of a ceramic composition mainly comprising $MTiO_3$-based ceramics (M represents one or several of Ca, Mg, La, Sr and Nd) and said insulating layer is composed of a ceramic composition mainly comprising $MgO$-$SiO_2$-$CaO$-based ceramics, which is defined by an area surrounded by the lines connecting points A, B, C, $E_1$, F and G as shown in FIG. 3 and listed below:

|   | X | Y | Z |
|---|----|----|----|
| A | 60 | 40 | 0 |
| B | 40 | 60 | 0 |
| C | 30 | 60 | 10 |
| $E_1$ | 30 | 40 | 30 |
| F | 40 | 30 | 30 |
| G | 60 | 30 | 10 |

6. A multilayer substrate with inner capacitors according to claim 5, wherein said insulating layer includes at least one crystal phase of forsterite ($Mg_2SiO_4$), enstatite ($MgSiO_3$), monticellite ($CaMgSiO_4$) or akermanite ($Ca_2MgSi_2O_7$).

7. A multilayer substrate with inner capacitors according to claim 5, wherein said dielectric layer and said insulating layers, between which said capacitor section being composed of said dielectric layer portions and electrode layers are sandwiched, can be co-fired.

8. A multilayer substrate with inner capacitors according to claim 1, wherein said dielectric layer is composed of a ceramic composition mainly comprising $MTiO_3$-based ceramics (M represents one or several of Ba, Ca, Mg, La, Sr and Nd) and said insulating layer is composed of a ceramic composition mainly comprising $MgO$-$SiO_2$-$CaO$-based ceramics, which is defined by an area surrounded by the lines connecting points $A_1$, $B_1$, D, $E_1$, F and G as shown in FIG. 4 and listed below:

|   | X | Y | Z |
|---|----|----|----|
| $A_1$ | 60 | 36 | 4 |
| $B_1$ | 46 | 50 | 4 |
| D | 30 | 50 | 20 |
| $E_1$ | 30 | 40 | 30 |
| F | 40 | 30 | 30 |
| G | 60 | 30 | 10 |

9. A multilayer substrate with inner capacitors according to claim 8, wherein said insulating layer includes at least one crystal phase of forsterite ($Mg_2SiO_4$), merwinite ($Ca_3MgSi_2O_8$), monticellite ($CaMgSiO_4$), akermanite ($Ca_2MgSi_2O_7$) or enstatite ($MgSiO_3$).

10. A multilayer substrate with inner capacitors according to claim 9, wherein said dielectric layer and said insulating layers, between which said capacitor section being composed of said dielectric layer portions and electrode layers are sandwiched, can be co-fired.

11. A multilayer substrate with inner capacitors according to claim 10, wherein said insulating layer includes at least one crystal phase of forsterite ($Mg_2SiO_4$), merwinite ($Ca_3MgSi_2O_8$), monticellite ($CaMgSiO_4$), akermanite ($Ca_2MgSi_2O_7$), enstatite ($MgSiO_3$) or spinel ($MgAl_2O_4$).

12. A multilayer substrate with inner capacitors according to claim 10, wherein said insulating layer is composed of a ceramic composition comprising $MgO$-$SiO_2$-$CaO$-based ceramics, which is defined by an area surrounded by the lines connecting points $A_1'$, $B_2'$, C', $E_1'$, F' and G' as shown in FIG. 5 and listed below, and said insulating layer also comprises $Al_2O_3$ ranging between 2 and 15 weight % of the total (100 weight %) of MgO, $SiO_2$ and CaO:

|   | X | Y | Z |
|---|----|----|----|
| $A_1'$ | 55 | 40 | 5 |
| $B_2'$ | 45 | 50 | 5 |
| C' | 40 | 50 | 10 |
| $E_1'$ | 40 | 40 | 20 |
| F' | 45 | 35 | 20 |
| G' | 55 | 35 | 10 |

13. A multilayer substrate with inner capacitors according to claim 1, wherein said dielectric layer is composed of a ceramic composition mainly comprising $MTiO_3$-based ceramics (M represents one or several of Ba, Ca, Mg, La, Sr and Nd) and said insulating layer is composed of a ceramic composition comprising $MgO$-$SiO_2$-$CaO$-based ceramics, which is defined by an area surrounded by the lines connecting points $A_1$, $B_2$, C, $E_1$, F and G as shown in FIG. 5 and listed below, and said insulating layer also comprises $Al_2O_3$ ranging between 1 and 15 weight % of the total (100 weight %) of MgO, $SiO_2$ and CaO, with points $A_1$, $B_2$, C, $E_1$, $F_1$ and G and the lines connecting the points excluded from the area:

|   | X | Y | Z |
|---|----|----|----|
| $A_1$ | 60 | 36 | 4 |
| $B_2$ | 36 | 60 | 4 |
| C | 30 | 60 | 10 |
| $E_1$ | 30 | 40 | 30 |
| F | 40 | 30 | 30 |
| G | 80 | 30 | 10 |

14. A multilayer substrate with inner capacitors according to claim 10 or 13, wherein said dielectric layer and said insulating layers, between which said capacitor section being composed of said dielectric layer portions and electrode layers are sandwiched, can be co-fired.

* * * * *